United States Patent
Hara et al.

(10) Patent No.: US 8,189,303 B2
(45) Date of Patent: May 29, 2012

(54) THIN FILM MAGNETIC HEAD HAVING A PAIR OF MAGNETIC LAYERS WHOSE MAGNETIZATION IS CONTROLLED BY SHIELD LAYERS

(75) Inventors: Shinji Hara, Tokyo (JP); Yoshihiro Tsuchiya, Tokyo (JP); Tsutomu Chou, Tokyo (JP); Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 949 days.

(21) Appl. No.: 12/222,543

(22) Filed: Aug. 12, 2008

(65) Prior Publication Data

US 2010/0039734 A1    Feb. 18, 2010

(51) Int. Cl.
  *G11B 5/39* (2006.01)
  *G11B 5/11* (2006.01)
(52) U.S. Cl. .................. 360/319; 360/324.12
(58) Field of Classification Search ............. 360/324.12, 360/319
See application file for complete search history.

(56) References Cited

U.S. PATENT DOCUMENTS

| | | | |
|---|---|---|---|
| 6,169,647 B1 * | 1/2001 | Mao et al. | 360/324.11 |
| 6,724,583 B2 | 4/2004 | Seigler et al. | |
| 7,035,062 B1 | 4/2006 | Mao et al. | |
| 7,298,595 B2 * | 11/2007 | Gill | 360/314 |
| 7,561,385 B2 * | 7/2009 | Nakamura et al. | 360/324.12 |
| 7,606,007 B2 * | 10/2009 | Gill | 360/319 |
| 2009/0296283 A1 * | 12/2009 | Mizuno et al. | 360/319 |
| 2010/0027168 A1 * | 2/2010 | Chou et al. | 360/319 |

FOREIGN PATENT DOCUMENTS

| | | |
|---|---|---|
| JP | A-H08-212521 | 8/1996 |
| JP | A-H09-274712 | 10/1997 |
| JP | 2002-298314 | 10/2002 |
| JP | A-2007-109807 | 4/2007 |
| JP | B-3950045 | 4/2007 |
| WO | WO 02/07153 A2 | 1/2002 |

OTHER PUBLICATIONS

Office Action dated Jun. 23, 2010 from the Japanese Patent Office in the corresponding JP Application No. 2009-095920 (English Translation).

* cited by examiner

*Primary Examiner* — Julie Anne Watko
(74) *Attorney, Agent, or Firm* — Posz Law Group, PLC

(57) ABSTRACT

A thin film magnetic head includes a magneto-resistance (MR) laminated body, a lower shield layer and an upper shield layer that face the first MR magnetic layer. The lower and upper shield layers respectively have first and second anti-parallel layers and first and second antiferromagnetic layers. An exchange coupling intensity relating to an antiferromagnetic coupling between the second anti-parallel layer and the second antiferromagnetic layer is greater in the peripheral area of a projection area than that of the projection area of the upper shield layer side end surface of the MR laminated body to the film surface's orthogonal direction.

20 Claims, 11 Drawing Sheets

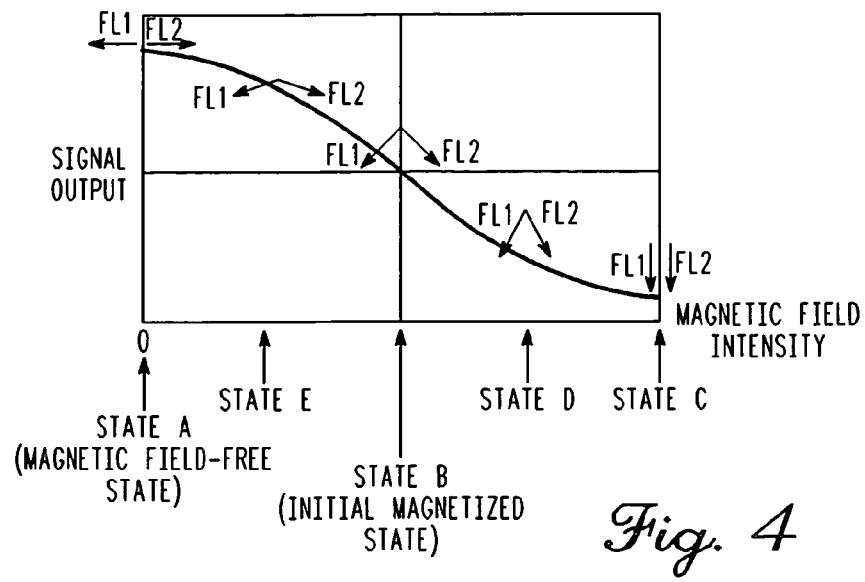
Fig. 4
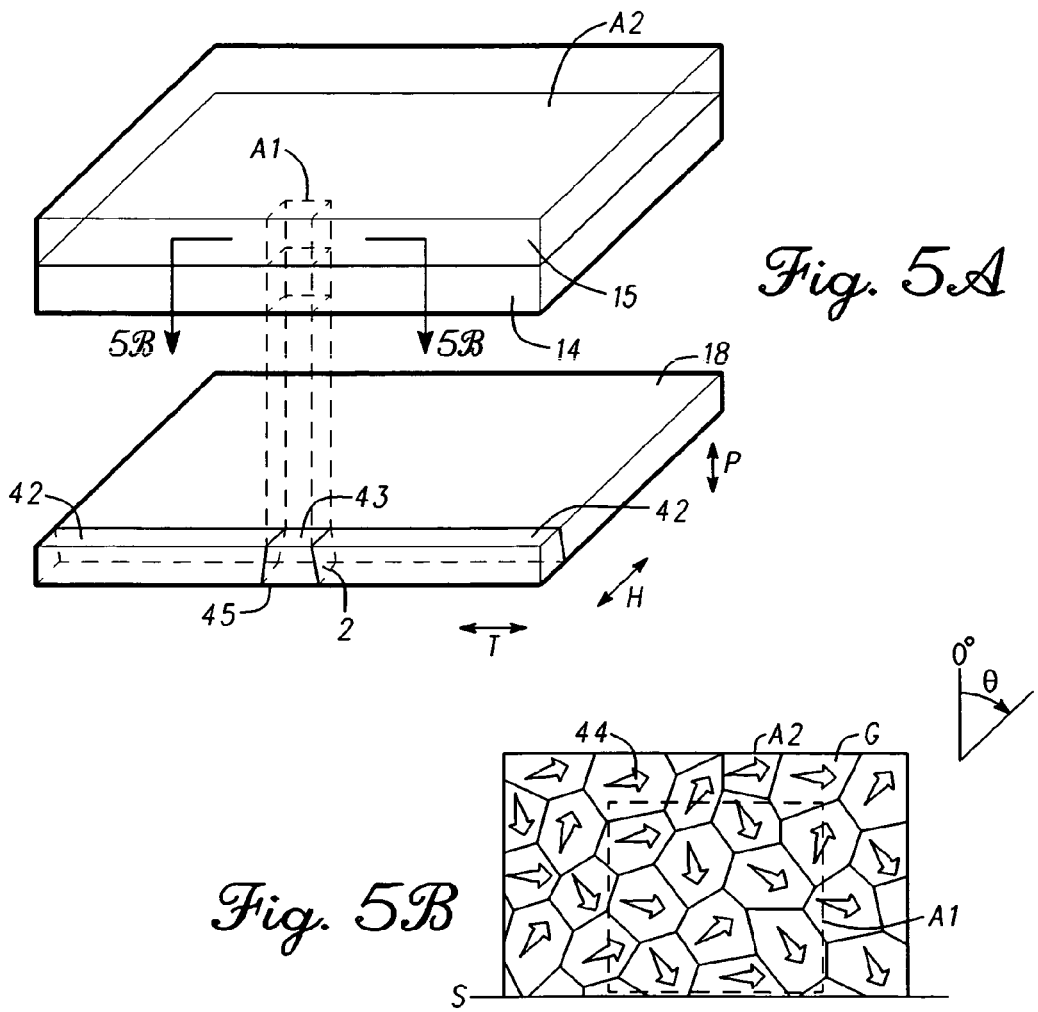
Fig. 5A
Fig. 5B

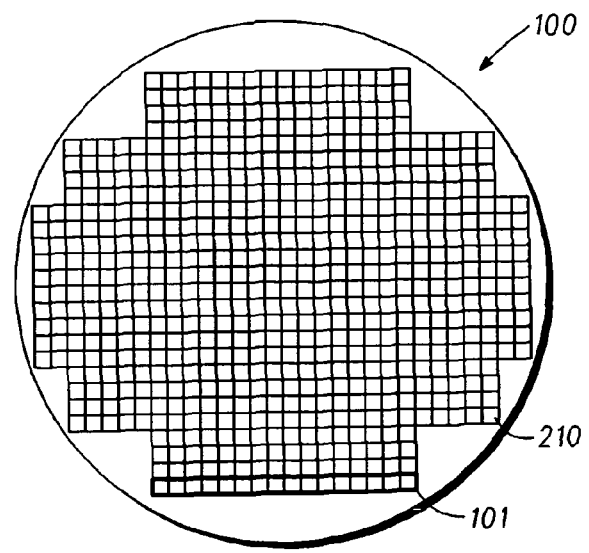
Fig. 9
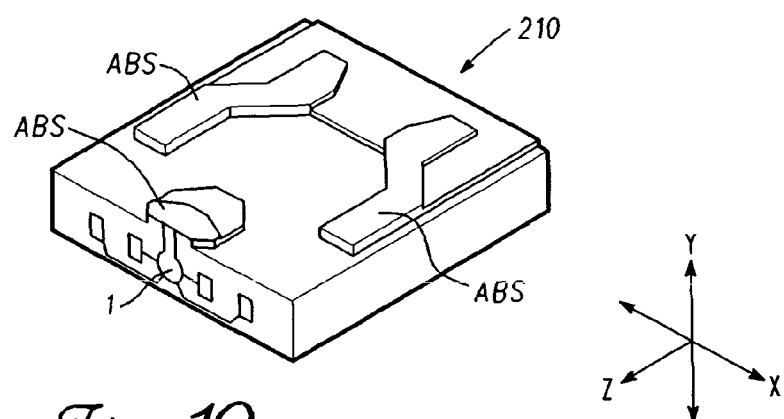
Fig. 10
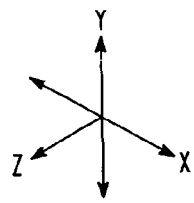
Fig. 11
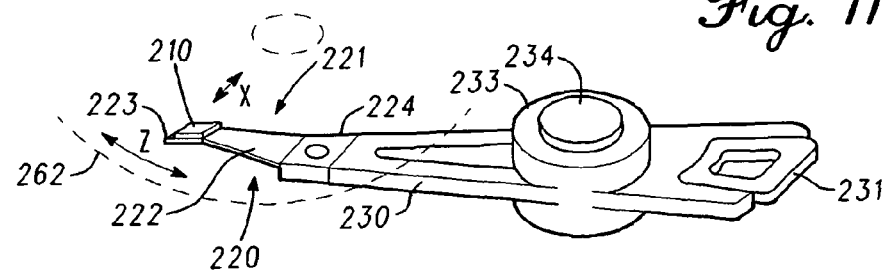

THIN FILM MAGNETIC HEAD HAVING A PAIR OF MAGNETIC LAYERS WHOSE MAGNETIZATION IS CONTROLLED BY SHIELD LAYERS

BACKGROUND

1. Field of the Invention

The present invention relates to a thin film magnetic head, and particularly relates to a device structure of the thin film magnetic head comprising a pair of magnetic layers where a direction of magnetization is changed relative to an external magnetic field.

2. Description of the Related Art

Associated with high recording density of a hard disk drive (HDD), a supersensitive and high-power head is in demand. As a head fulfilling this request, a spin-valve head has been invented. A pair of ferromagnetic layers via a nonmagnetic middle layer are established in this spin-valve head. An antiferromagnetic layer is arranged by making contact with one of the ferromagnetic layers, and the direction of magnetization of the ferromagnetic layer is fixed to one direction due to an exchange coupling with the antiferromagnetic layer. In the other ferromagnetic layer, its direction of magnetization freely rotates relative to the external magnetic field. This ferromagnetic layer is also referred to as a free layer. In the spin-valve head, a change in magnetoresistance is realized by a change in a relative angle of spins in these two ferromagnetic layers. The pair of ferromagnetic layers are interposed by a pair of shield layers, and an external magnetic field from an adjacent bit on the same track of a recording medium is blocked.

The exchange coupling between the antiferromagnetic layer and the ferromagnetic layer is one of the essential characteristics in the spin-valve head. However, in view of further high recording density advances, and when the read gap (width in a traveling direction of a medium signal when the medium signal is read by a magnetic head; correlated to a thickness of a film interposed in between shields) becomes approximately 20 nm, there is no space to contain the antiferromagnetic layer within the read gap. Then, a technology to control the direction of magnetization of the ferromagnetic layer and to change a relative angle formed with the directions of magnetizations of two ferromagnetic layers according the external magnetic field in some way is required. A thin film magnetic head having two free layers whose directions of magnetization change according to the external magnetic field and a nonmagnetic middle layer interposed by these free layers is disclosed in the specification of U.S. Pat. No. 7,035,062. The two free layers are exchange-coupled according to RKKY (Rudermann, Kittel, Kasuya and Yoshida) interaction via the nonmagnetic middle layer, and they are magnetized antiparallel to each other in the state where no magnetic field is applied at all (hereafter, this state is referred to as a nonmagnetic field state). A bias magnetic layer is established on rear surfaces of the two free layers and the nonmagnetic middle layer viewed from the air bearing part surface (ABS), and a bias magnetic field is applied in a direction at right angles to the ABS. The directions of magnetization of the two free layers form a constant relative angle due to the magnetic field from the bias magnetic layer. When an external magnetic field in the direction at right angles to the ABS is provided from the recording medium, the directions of magnetization of the two free layers are changed, and as a result, the relative angle formed with the directions of magnetization of the two free layers is changed and electrical resistance of the sense current is changed. It becomes possible to detect the external magnetic field by utilizing this characteristic. As described above, in the film configuration using the two free layers, because the antiferromagnetic layer becomes unnecessary, there is potential where the film configuration is simplified and the reduction of a read gap becomes easy. Furthermore, in this specification, "parallel" means that directions of magnetization are in parallel with each other and both components are orientated toward the same direction, and "antiparallel" means that directions of magnetization are in parallel with each other; however, both components are orientated toward an opposite direction from each other.

However, in the thin film magnetic head with a method where two free layers are magnetically tied due to the RKKY interaction, a material utilizing as a nonmagnetic middle layer is limited and the improvement of a rate of change in magnetoresistance cannot also be expected. For example, Cu shows the RKKY effect and has superior spin conduction; however, because the resistance is too low, it is not the most appropriate as a nonmagnetic middle layer in the film configuration using the two free layers. Then, another technology to magnetize the two free layers to directions antiparallel to each other becomes required.

SUMMARY

The present invention targets a thin film magnetic head having a magneto-resistance (MR) laminated body where a first MR magnetic layer (free layer) whose direction of magnetization is changed according to an external magnetic field, a nonmagnetic middle layer and a second MR magnetic layer (free layer) whose direction of magnetization is changed according to the external magnetic field are arranged in respective order by making contact with each other, and a bias magnetic field applying means that is established on an opposite surface from the ABS of the MR laminated layer, and that applies a bias magnetic field in a direction at right angles to the ABS to the MR laminated body. The objective of the present invention is to provide a thin film magnetic head where a high rate of change in magnetization resistance can be obtained by controlling the directions of magnetization of two MR magnetic layers in non-magnetic field state to antiparallel directions to each other not depending upon a magnetic interaction between these MR magnetic layers, and the rate of change in magnetization resistance varies less, and reduction of read gap is easy.

The thin film magnetic head relating to one embodiment of the present invention has a magneto-resistance (MR) laminated body that has a first magneto-resistance (MR) magnetic layer with a direction of magnetization that is changed according to an external magnetic field, a nonmagnetic middle layer and a second magneto-resistance (MR) magnetic layer with a direction of magnetization that is changed according to the external magnetic field, and wherein the first MR magnetic layer, the nonmagnetic middle layer and the second MR magnetic layer are respectively laminated by contacting each other in the order, and a lower shield layer and an upper shield layer that face the first MR magnetic layer and the second MR magnetic layer, respectively, and which are arranged in a matter of sandwiching the MR laminated body in an orthogonal direction relative to a film surface of the MR laminated body, and also which function as electrodes for flowing a sense current in the orthogonal direction relative to the film surface of the MR laminated body; and a bias magnetic field applying means that is established on an opposite surface from an air bearing surface (ABS) of the MR laminated body, and that applies a bias magnetic field in a direction at right angles to the ABS to the MR laminated body. The lower shield layer has a first anti-parallel layer that faces the first MR magnetic layer, and that applies an exchange coupling magnetic field in parallel to the ABS to the first MR magnetic field, and a first antiferromagnetic layer that is formed on the rear surface of the first anti-parallel layer viewed from the first MR magnetic layer by contacting the first anti-parallel layer, and that is exchange coupled with the first anti-parallel layer. The upper shield layer has a second anti-parallel layer that faces the second MR magnetic layer, and that applies an exchange coupling magnetic field to the second MR magnetic field, the exchange coupling magnetic field being in a parallel direction to the ABS and in an anti-parallel direction to an exchange coupling magnetic field applied to the first MR magnetic layer by the first anti-parallel layer, a second antiferromagnetic layer is established on the rear surface of the second anti-parallel layer viewed from the second MR magnetic field by contacting the second anti-parallel layer, and that is exchange coupled with the second anti-parallel layer. Further, the exchange coupling intensity relating to the antiferromagnetic coupling between the second anti-parallel layer and the second antiferromagnetic layer is greater in the peripheral area of a projection area than that of the projection area of the upper shield layer side end surface of the MR laminated body to the film surface's orthogonal direction.

In the thin film magnetic head as configured above, a magnetic field from the first and second anti-parallel layers whose directions of magnetization are solidly fixed due to the antiferromagnetic coupling with the first and second antiferromagnetic layers is applied to the first and second MR magnetic layers. Since the magnetic field from the first anti-parallel layer and the magnetic field from the second anti-parallel layer are antiparallel to each other, the first and second MR magnetic layers are magnetized to the antiparallel direction from each other in the non-magnetized state. However, in actuality, since a bias magnetic filed in the direction at right angles to the ABS is applied from the bias magnetic field applying means, the first and second MR magnetic layers are magnetized to the state between the antiparallel and parallel. When the external magnetic field from the recording medium is applied regarding this magnetization state as an initial magnetization state, because a relative angle formed with the directions of magnetization of the first and second MR magnetic layers is changed according to the magnitude and orientation of the external magnetic field, it becomes possible to detect the external magnetic field utilizing the magnetic resistance effect.

In addition, since the first and second antiferromagnetic layers and the first and second anti-parallel layers also have a function as a shield layer, respectively, they contribute to the reduction of the read gap. The present invention is featured such that the shield layer that is not magnetically coupled with the MR magnetic layers conventionally is magnetically coupled with the MR magnetic layer.

In the case that the particle size forming the second antiferromagnetic layer is large, the direction of magnetization of the second antiferromagnetic layer tends to vary in a projection area where a magnetic effect on the second MR magnetic layer is great.

This is because the number of grains that can be accommodated in the projection area whose film area has restriction is limited and since each grain is magnetized along the magnetization easy axis, an average magnetization orientation varies. As a result, the direction of magnetization of the second anti-parallel layer varies within a projection area, and a direction of magnetization of the second MR magnetic layer also tends to vary. However, since the exchange coupling intensity in a peripheral area where a film area is easily secured and variation of a macro in the direction of magnetization is small is set relatively high; in other words, the exchange coupling intensity in the projection area is set relatively low, the effect of variation in the direction of magnetization of the second antiferromagnetic layer in the projection area is relatively reduced and the direction of magnetization in the non-magnetization state in the second MR magnetic layer is stabilized and the variation of the rate of change in magnetoresistance is controlled.

In order to relatively increase the exchange coupling intensity in the peripheral area, a metal foundation layer having a crystal structure of amorphous, body-centered cubic lattice or closed-packed hexagonal lattice is established between an insulating layer and the second anti-parallel layer.

As described above, a thin film magnetic head where a high rate of change in magnetization resistance can be obtained, and variation in the rate of change in magnetization resistance is small and reduction of the read gap is easy can be provided.

The above objectives, as well as other objectives, characteristics and advantages of the present invention will be clear according to descriptions below for referring to attached drawings where the present invention is illustrated.

BRIEF DESCRIPTION OF THE DRAWINGS

FIG. 4 is a graph showing a relationship between magnetic field intensity to be applied to the first and second MR magnetic layers and a signal output;

FIG. 5A is a pattern perspective view of an MR laminated body, a metal foundation layer, a second anti-parallel layer and a second antiferromagnetic layer;

FIG. 5B is a cross sectional view of the second antiferromagnetic layer along the sectional line 5B-5B of FIG. 5A;

FIG. 9 is a plan view of a wafer relating to the production of the thin film magnetic head;

FIG. 10 is a perspective view of a slider of the present invention;

FIG. 11 is a perspective view of a head arm assembly including a head gimbal assembly where the slider of the present invention is incorporated;

DETAILED DESCRIPTION

Figure 1:
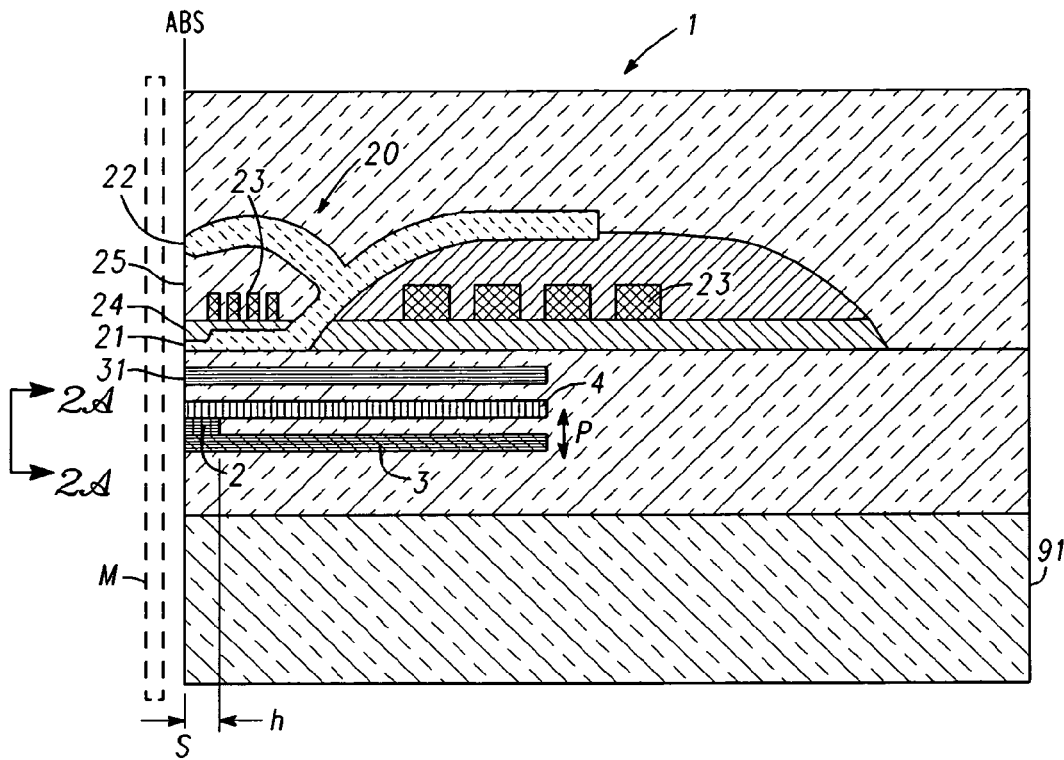
FIG. 1 is a side cross sectional view of a thin film magnetic head relating to one embodiment of the present invention.
Figure 2A:
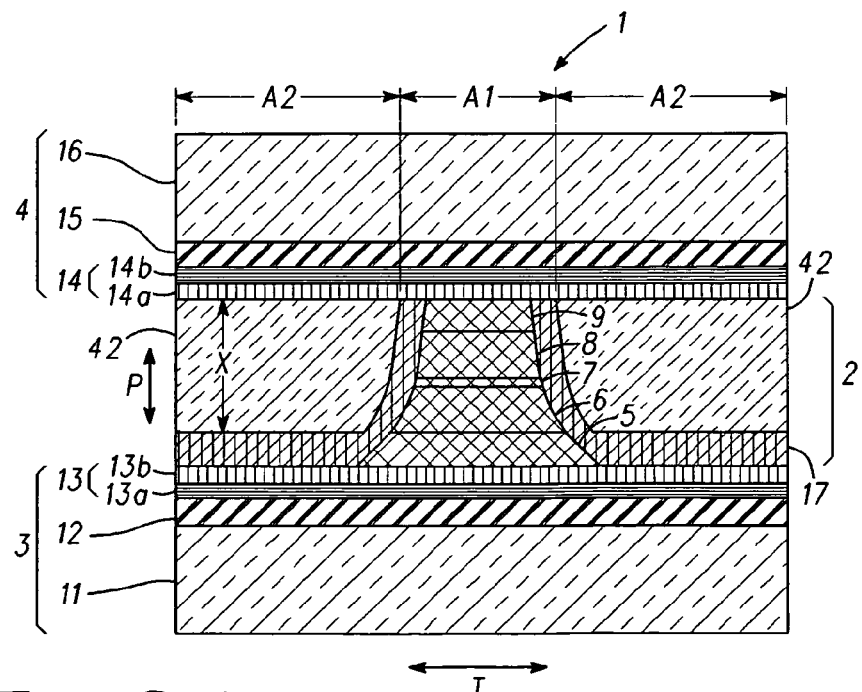
FIG. 2A is a side view of a reading part of the thin film magnetic head viewed from the direction of sectional line 2A-2A in FIG. 1.
Figure 2B:
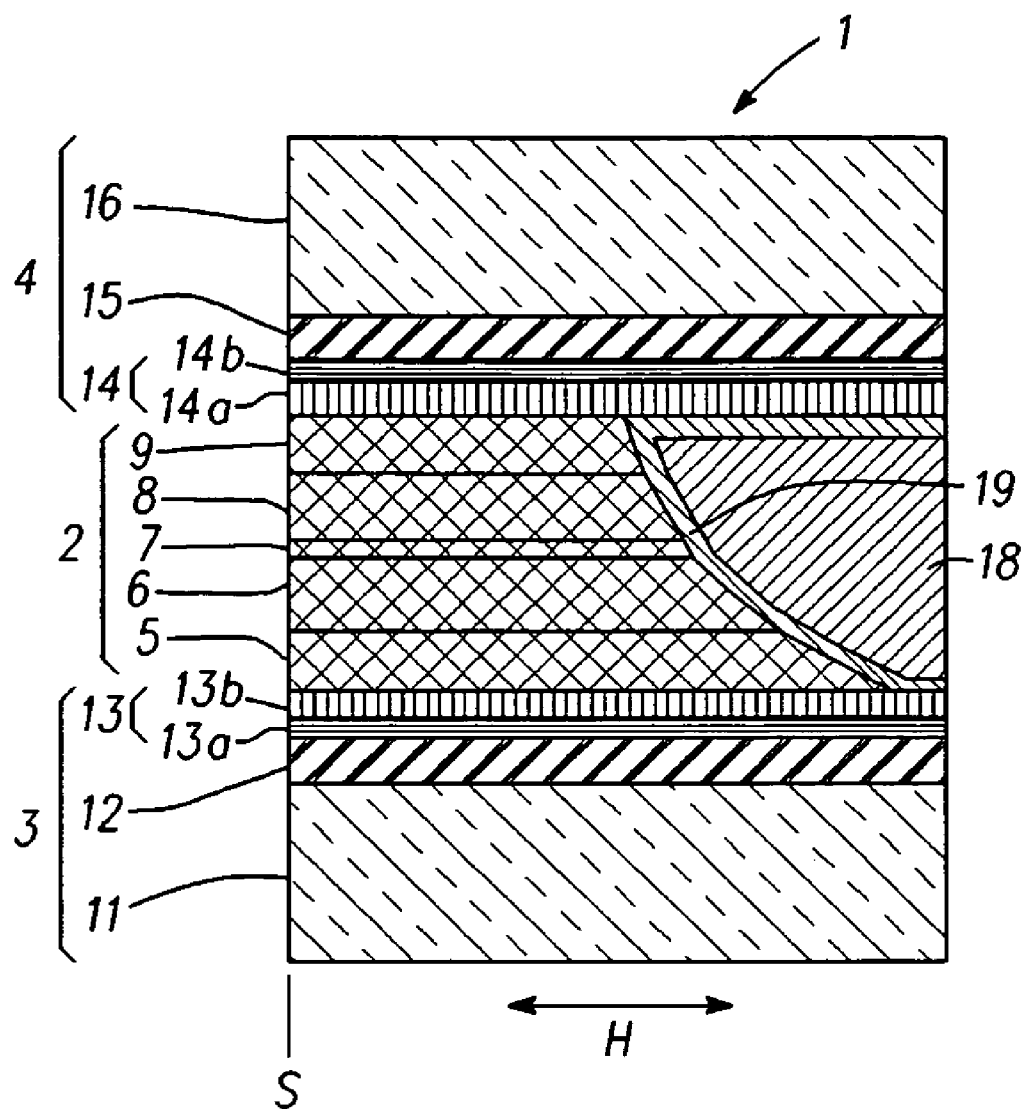
FIG. 2B is a cross sectional view of the reading part of the thin film magnetic head viewed from the same direction as that in FIG. 1.

Hereafter, the thin film magnetic head relating to one embodiment of the present invention will be described with reference to drawings. FIG. 1 is a side cross sectional view of the thin film magnetic head of the present embodiment. FIG. 2A is a side view of the reading part of the thin film magnetic head viewed from the 2A-2A direction of FIG. 1, i.e., from the ABS (hereinafter, referenced with S); and FIG. 2B is a cross sectional view of the reading part of the thing film magnetic head viewed from the same direction as that in FIG. 1. The ABS S is an opposing surface with the recording medium M in the thing film magnetic head 1.

The thin film magnetic head 1 has an MR laminated body 2 and the upper and lower shield layers 3 and 4 established in the film surface's orthogonal direction P of the MR laminated body 2 by inter posing the MR laminated body 2. Table 1 shows a film configuration of the MR laminated body 2 and the upper and lower shield layers 3 and 4. The table shows layers from the lower shield layer 3 toward the upper shield layer 4 from bottom up in order. Furthermore, the direction of magnetization corresponds to that of FIG. 3A.

TABLE 1

| | Layer constitution | | Thickness (nm) | Direction of magnetization |
|---|---|---|---|---|
| Upper shield layer 4 | Second main shield layer 16 | NiFe layer | 1000-2000 | |
| | Second antiferromagnetic layer 15 | IrMn layer | 6 | |
| | Second exchange coupling magnetic field application layer 14 | CoFe layer 14b | 1.5 | → |
| | | NiFe layer 14a | 20 | → |
| MR laminated body 2 | Second magnetic coupling layer 9 | Ru layer 9c | 0.8 | |
| | | CoFe layer 9b | 1 | ← |
| | | Ru layer 9a | 0.8 | |
| | Second MR magnetic layer 8 | CoFe layer | 3 | → |
| | Nonmagnetic middle layer 7 | ZnO layer | 2 | |
| | First MR magnetic layer 6 | CoFe layer | 3 | ← |
| | First magnetic coupling layer 5 | Ru layer 5e | 0.8 | |
| | | CoFe layer 5d | 1 | → |
| | | Ru layer 5c | 0.8 | |
| | | CoFe layer 5b | 1 | ← |
| | | Ru layer 5a | 0.8 | |
| Lower shield layer 3 | First exchange coupling magnetic field application layer 13 | NiFe layer 13b | 20 | → |
| | | CoFe layer 13b | 1.5 | → |
| | First antiferromagnetic layer 12 | IrMn layer | 6 | |
| | First main shield layer 11 | NiFe layer | 1000-2000 | |

Referring to FIG. 2A and Table 1, the MR laminated body 2 includes a first MR magnetic layer 6 whose direction of magnetization changes according to the external magnetic field, a nonmagnetic middle layer 7 and a second MR magnetic layer 8 whose direction of magnetization changes according to the external magnetic field, and the first MR magnetic layer 6, the nonmagnetic middle layer 7 and the second MR magnetic layer 8 make contact with each other in respective order. Further, a first magnetic coupling layer 5 is adjacent to the first MR magnetic layer 6, and second magnetic coupling layer 9 is established adjacent to a second MR magnetic layer 8.

The first MR magnetic layer 6 and the second MR magnetic layer 8 are made of a CoFe layer, and the nonmagnetic middle layer 7 is made of a ZnO layer. The first MR magnetic layer 6 and the second MR magnetic layer 8 can be formed with NiFe or CoFeB. The first MR magnetic layer 6 can also be formed with a two-layer film of NiFe/CoFe, and the second MR magnetic layer 8 can also be formed with a two-layer film of CoFe/NiFe. Herein, in this specification, the description of A/B/C . . . indicates the films A, B, C . . . are laminated in respective order. In other words, in the case that the first MR magnetic layer 6 and the second MR magnetic layer 8 is formed with a two-layer configuration, respectively, it is preferable that the CoFe layer makes contact with the ZnO layer. The nonmagnetic middle layer 7 may be formed with MgO, $Al_2O_3$, AlN, $TiO_2$ or NiO. In the case of using metal or a semiconductor, such as ZnO, as the nonmagnetic middle layer 7, the thin film magnetic head 1 functions as a current perpendicular to the plane (CCP)-giant magneto-resistance element, and in the case of using an insulating body, such as MgO, the thin film magnetic head functions as a tunneling magneto-resistance (TMR).

The first magnetic coupling layer 5 is established between the first MR magnetic layer 6 and a first anti-parallel layer 13 of the lower shield layer 3, and as described below, the first magnetic coupling layer 5 has a function to transmit the exchange magnetic field from the first anti-parallel layer 13 to the first MR magnetic layer 6. The first magnetic coupling layer 5 has a laminated constitution of five layers: Ru layer/ CoFe layer/Ru layer/CoFe layer/Ru layer.

Similarly, the second magnetic coupling layer 9 is established between the second MR magnetic layer 8 and the second anti-parallel layer 14 of the upper shield layer 4, and as described below, the second magnetic coupling layer 9 has a function to transmit the exchange magnetic field from the second anti-parallel layer 14 to the second MR magnetic field 8. The second magnetic coupling layer 9 has a laminated constitution of three layers: Ru layer/CoFe layer/Ru layer.

The lower shield layer 3 also functions as an electrode for flowing a sense current to the film surface's orthogonal direction P of the MR laminated body 2, along with the upper shield layer 4. The lower shield layer 3 is established at the side facing toward the first MR magnetic layer 6 via the first magnetic coupling layer 5. The shield layer 3 has a first anti-parallel layer 13, a first antiferromagnetic layer 12 established on the rear surface of the first anti-parallel layer 13 viewed from the first MR magnetic layer 6 by making contact with the first anti-parallel layer 13, and a first main shield layer 11 established on the rear surface of the first antiferromagnetic layer 12 viewed from the first MR magnetic layer 6. The first anti-parallel layer 13 has a two-layer constitution with a CoFe layer 13a established by making contact with the first antiferromagnetic layer 12 and a NiFe layer 13b established by making contact with both the CoFe layer 13a and the first magnetic coupling layer 5. It is desirable that the thickness of the first anti-parallel layer 13 is within the range of 5 nm to 80 nm as described below. The first antiferromagnetic layer 12 is made of IrMn, and is strongly exchange coupled in between the adjacent CoFe layer 13a. Other than the one mentioned above, the first antiferromagnetic layer 12 can be formed with alloy, such as Fe—Mn, Ni—Mn, Pt—Mn or Pd—Pt—Mn, or a combination of these including IrMn. The first main shield layer 11 is made of a NiFe layer, and blocks the external magnetic field from the adjacent bit on the same track of the recording medium M. The configuration of the first main shield layer 11 is the same as a shield layer, which has been well-known, and in general, it has 1 μm to 2 μm of thickness. The first main shield layer 11 is thicker than the first anti-parallel layer 13 and the first antiferromagnetic layer 12. Further, because the first main shield layer 11 has a multi-domain structure, its permeability is high. Consequently, the first main shield layer 11 effectively functions as a shield.

The configuration of the upper shield layer 4 is similar to that of the lower shield layer 3. In other words, the upper shield layer 4 is established at the side facing toward the second MR magnetic layer 8 via the second magnetic coupling layer 9. The upper shield layer 4 has a second anti-parallel layer 14, a second antiferromagnetic layer 15 established on the rear surface of the second anti-parallel layer 14 viewed from the second MR magnetic layer 8 by making contact with the second anti-parallel layer 14, and a second main shield layer 16 established on the rear surface of the second antiferromagnetic layer 15 viewed from the second MR magnetic layer 8. The second anti-parallel layer 14 has a two-layer constitution with a CoFe layer 14b established by making contact with the second antiferromagnetic layer 15 and a NiFe layer 14a established by making contact with both the CoFe layer 14b and the second magnetic coupling layer 9. The thickness of the second anti-parallel layer 14 is within the range of 5 nm to 80 nm. The second antiferromagnetic layer 15 is made of IrMn, and is strongly exchange coupled in between the adjacent CoFe layer 14b. Other than the one mentioned above, the second antiferromagnetic layer 15 can be formed with alloy, such as Fe—Mn, Ni—Mn, Pt—Mn or Pd—Pt—Mn. The second main shield layer 16 is made of a NiFe layer, and blocks the external magnetic field from an adjacent bit on the same track of the recording medium. The configuration of the second main shield layer 16 is the same level as that of the conventionally well-known shield layer, and it has generally 1 μm to 2 μm of thickness. The second main shield layer 16 is thicker than the second anti-parallel layer 14 and the second antiferromagnetic layer 15. Further, since the second main shield layer 16 has a multi-domain structure, its permeability is high. Consequently, the second main shield layer 16 effectively functions as a shield.

The upper and lower shield layers 3 and 4 and the first and second antiferromagnetic layer 12 and 15 make contact with the CoFe layers 13a and 14b of the first and second anti-parallel layers 13 and 14, respectively. This is for securing great exchange coupling intensity with the first and second antiferromagnetic layers 12 and 15. If the first and second antiferromagnetic layers 12 and 15 make contact with the NiFe layers 13b and 14a, the exchange coupling intensity becomes smaller and it becomes difficult to solidly secure the directions of magnetization of the first and second anti-parallel layer 13 and 14 by the second antiferromagnetic layers 12 and 15. The NiFe layers 13b and 14a are established for improving a soft magnetic property and for effectively demonstrating the function as a shield layer.

A nonmagnetic layer (not shown), such as Cu, may be inserted between the second antiferromagnetic layer 15 and the second main shield layer 16. For the thickness of the nonmagnetic layer, in the case of Cu, approximately 1 nm is sufficient. The insertion of the nonmagnetic layer results in easy multi-domain of the main shield layer 16, and a shield performance to the external magnetic field of the main shield layer 16 is improved. However, in the case of not establishing the nonmagnetic layer, it becomes difficult to generate noise due to the movement of the magnetic domain of the main shield layer 16. Therefore, whether or not the nonmagnetic layer is inserted depends upon the design decision.

As shown in FIG. 2A, an insulating layer 17 made of $Al_2O_3$ is formed at both sides of the track width direction T of the MR. The establishment of the insulating layer 17 enables concentration of the sense current flowing in the film surface's orthogonal direction P of the MR laminated body 2 to the MR laminated body 2. It is acceptable that the insulating layer 17 is formed on the side of the MR laminated body 2 with thickness required for insulation, and an electrically conductive film may exist outside the insulating layer 17. However, even in that case, it is necessary that the lower shield layer 3 and the upper shield layer 4 are insulated.

In this embodiment, a metal foundation layer 42 is formed between the insulating layer 17 and the second anti-parallel layer 14. The metal foundation layer 42 has a crystal structure of amorphous, body-centered cubic lattice or close-packed hexagonal lattice, and is preferably with Ta, Cr, CrTi or Ru. It is preferable that the thickness X of the metal foundation layer 42 is 1 nm or more. Since the metal foundation layer 42 is formed between the upper shield layer 4 and the lower shield layer 3, an upper limit value of the thickness X is smaller than the gap between the upper shield layer 4 and the lower shield layer 3.

As shown in FIG. 2B, a bias magnetic field application layer 18, which is a bias magnetic field applying means, is established on the opposite surface of the ABS S of the MR laminated body 2 via an insulating layer 19 made of $Al_2O_3$. The bias magnetic applied layer 18 is a hard magnetic film made of CoPt or CoCrPt, and applies a bias magnetic field in a direction (height direction) H at right angles to the ABS S to the MR magnetic body 2. The insulating layer 19 prevents the sense current from flowing into the bias magnetic field application layer 18.

Referring to FIG. 1, a writing part 20 is established on the upper shield layer 4 via an interelement shield layer 31 formed by a sputtering method. The writing part 20 has a so-called perpendicular magnetic recording configuration. The magnetic pole layer for writing is composed of a main magnetic pole layer 21 and an auxiliary magnetic layer 22. These magnetic pole layers 21 and 22 are formed by a frame plating method. The main magnetic pole layer 21 is made of FeCo, and it is exposed on the ABS S in the direction substantially at right angles to the ABS S. A coil layer 23 extending over the gap layer 24 made of an insulating material is wound around the periphery of the main magnetic pole layer 21, and a magnetic flux is induced to the main magnetic layer 21 by the coil layer 23. The coil layer 23 is formed by a frame plating method. This magnetic flux is led to the inside of the main magnetic pole layer 21, and is discharged from the ABS S toward the recording medium. The main magnetic pole layer 21 is narrowed not only in the film surface's orthogonal direction P but in the track width direction T (in the paper plane orthogonal direction in FIG. 1; see FIG. 2A, as well), and a minute and strong magnetic field corresponding to the high record density is generated.

The auxiliary magnetic layer 22 is a magnetic layer that is magnetically coupled with the main magnetic layer 21. The supplementary magnetic layer 22 is a magnetic pole layer with approximately 0.01 μm to approximately 0.5 μm formed with alloys of any two or three of Ni, Fe and Co. The supplementary magnetic layer 22 is established by branching from the main magnetic pole layer 21, and faces the main magnetic pole layer 21 at the ABS S side via a gap layer 24 and a coil insulating layer 25. The end of the auxiliary magnetic layer 22 at the ABS S side forms a trailing shield part whose layer cross section is wider than other parts of the auxiliary magnetic layer 22. The establishment of this auxiliary magnetic layer 22 causes a more precipitous magnetic field gradient between the auxiliary magnetic layer 22 and the main magnetic pole layer 21 in the vicinity of the ABS S. As a result, jitter of the signal output becomes smaller and an error rate at the time of reading can be reduced.

Figure 3A:
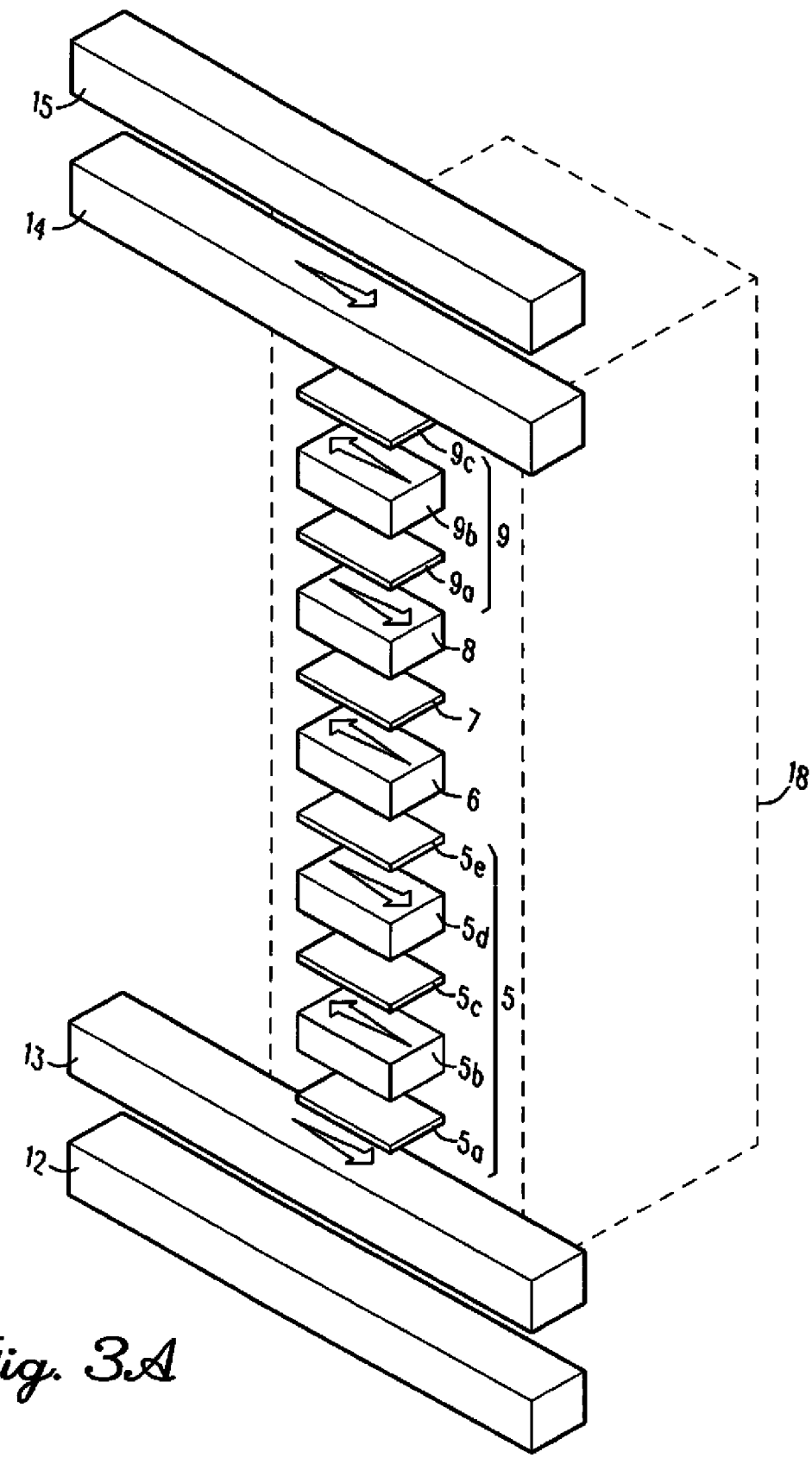
FIGS. 3A to 3D are conceptual diagrams (or exploded views) showing a principle of operation of the thin film magnetic head shown in FIG. 1.

Next, with reference to FIGS. 3A to 3D and FIG. 4, the principle of operation where the thin film magnetic head in this embodiment reads magnetic information recorded in the recording medium will be described. First, a magnetic field-free state where both the external magnetic field and a bias magnetic field from the bias magnetic field application layer 18 are not applied is assumed. FIG. 3A is a pattern diagram showing the magnetization state of the MR laminated body and the shield layer in this virtual state. In order to show that no bias magnetic field is applied, the bias magnetic field application layer 18 is indicated with a broken line. FIG. 4 is a pattern diagram showing a relationship between the magnetic field intensity applied to the first and second MR magnetic layers and a signal output. The horizontal axis indicates the magnetic field intensity and the vertical axis indicates the signal output. Furthermore, in each of FIGS. 3A to 3D, an outline arrow indicates the direction of magnetization of each magnetic layer, respectively.

The first antiferromagnetic layer 12 of the lower shield layer 3 and the second antiferromagnetic layer 15 of the upper shield layer 4 are pre-magnetized so as to have the same direction of magnetization (left-pointing). Therefore, the first anti-parallel layer 13 is magnetized to the right side in the drawing due to the antiferromagnetic coupling with the first antiferromagnetic layer 12. Similarly, the second anti-parallel layer 14 is magnetized to the right side in the drawing due to the antiferromagnetic coupling with the second antiferromagnetic layer 15.

The first magnetic coupling layer 5 has a laminated constitution with a Ru layer 5a, a CoFe layer 5b, a Ru layer 5c, a CoFe layer 5d and a Ru layer 5e, and the CoFe layer 5b and the first anti-parallel layer 13 are exchange-coupled via the Ru layer 5a. It is known that the exchange coupling intensity of Ru indicates a positive or negative value by depending upon the thickness, and for example, greatly negative exchange coupling intensity can be obtained with 0.4 nm, 0.7 nm and 1.7 nm. Herein, the negative exchange coupling intensity means that the directions of magnetization of the magnetic layers at both sides of the Ru layer are in antiparallel with each other. Therefore, if the thickness is set to these values, the CoFe layer 5b is magnetized toward the left-pointing in the drawing. Similarly, the CoFe layer 5b and the CoFe layer 5d are exchange-coupled via the Ru layer 5c. In addition, the CoFe layer 5d and the first MR magnetic layer 6 are exchange-coupled via the Ru layer 5e. If the thickness of the Ru layers 5c and 5e is set, for example, at 0.4 nm, 0.7 nm or 1.7 nm, the first MR magnetic layer 6 is magnetized toward the left-pointing in the drawing. The directions of magnetization of the second antiferromagnetic layer 15, the second anti-parallel layer 14, the second magnetic coupling layer 9 and the second MR magnetic layer 8 can be similarly considered. Therefore, in the example shown in FIG. 3A, the second MR magnetic layer 8 is magnetized in a right-pointing direction in the drawing.

The state A in FIG. 4 indicates the state in FIG. 3A, and since a bias magnetic field from the bias magnetic layer 18 and the external magnetic field from the recording medium M do not exist in a direction of magnetization FL1 of the first MR magnetic layer 6 and a direction of magnetization FL2 of the second MR magnetic layer 8, they are antiparallel from each other. It is needless to say, it is unnecessary that the direction of magnetization FL1 of the first MR magnetic layer 6 and the direction of magnetization FL2 of the second MR magnetic layer 8 do not have to be strictly antiparallel, and it is acceptable as long as the direction of magnetization can be rotated to a reverse direction from each other when the bias magnetic field is applied as described below.

As described above, the first magnetic coupling layer 5 is magnetically coupled with the first anti-parallel layer 13 and the first MR magnetic layer 6, and the first anti-parallel layer 13 plays a role of function to apply the exchange coupling magnetic field in the parallel direction with the ABS S to the first MR magnetic layer 6 via the first magnetic coupling layer 5. Similarly, the second magnetic coupling layer 9 is magnetically coupled with the second anti-parallel layer 14 and the second MR magnetic layer 8, and the second anti-parallel layer 14 plays a role of function to apply the exchange coupling magnetic field in the parallel direction with the ABS S to the second MR magnetic layer 8 via the second magnetic coupling layer 9. As a result, the first MR magnetic layer 6 and the second MR magnetic layer 8 are magnetized to an anti-parallel direction toward each other in the magnetic field-free state.

Figure 3B:
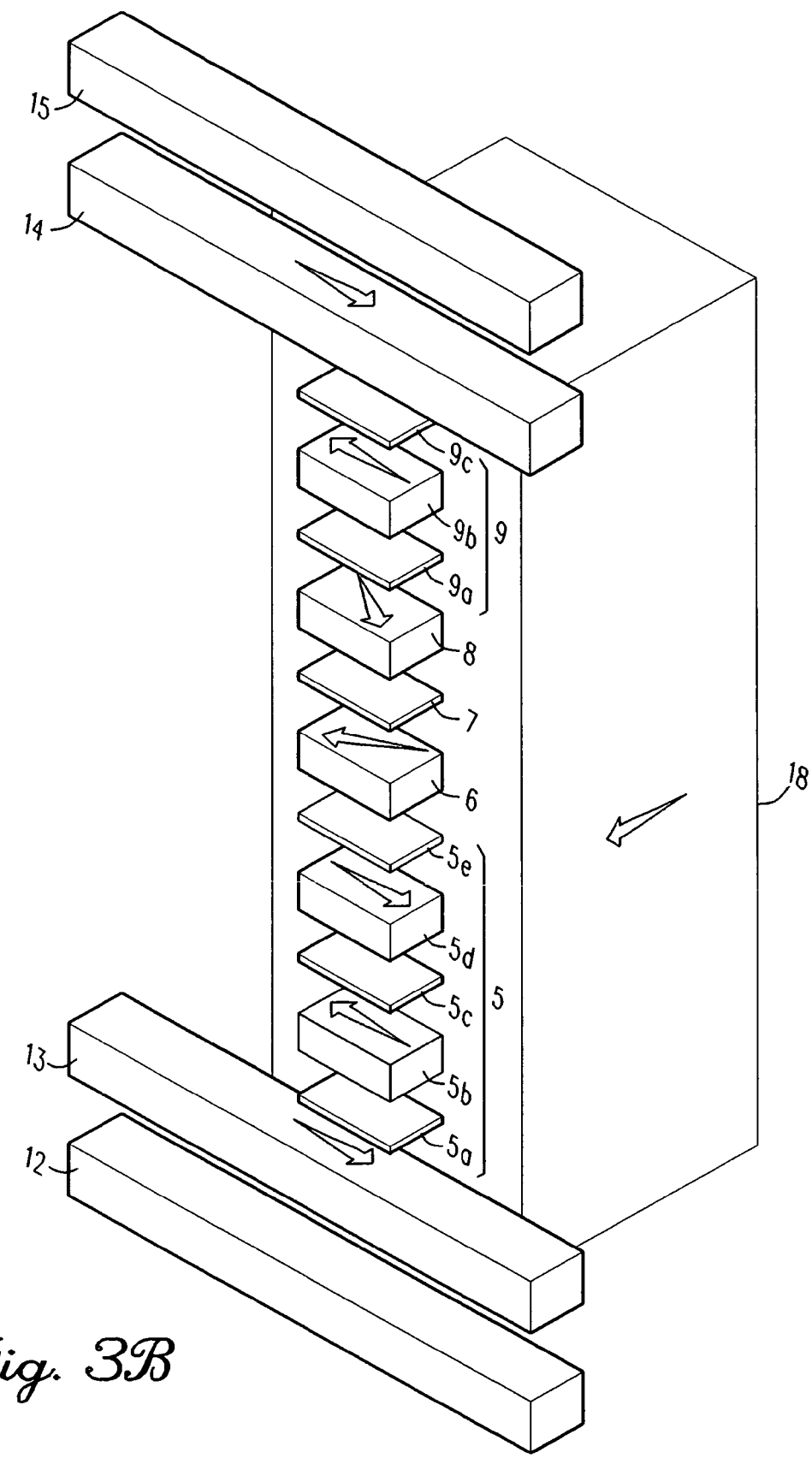

Since a bias magnetic field is actually applied to the first MR magnetic layer 6 and the second MR magnetic layer 8, next, as shown in FIG. 3B, an external magnetic field is not applied, and a state where only a bias magnetic field is applied is considered. Herein, it is assumed that the bias magnetic field is applied to a direction toward the ABS S. The directions of magnetization of the first MR magnetic layer 6 and the second MR magnetic layer 8 rotate toward the ABS S by being influenced by the bias magnetic field, respectively. As a result, the directions of magnetization of the first MR magnetic layer 6 and the second MR magnetic layer 8 rotate from the antiparallel state toward the parallel state, and it becomes in the initial magnetized state (a state where only a bias magnetic field is applied) as the state B shown in FIG. 4. Furthermore, in FIG. 4, for the orientations of the bias magnetic field and the external magnetic field, the downward orientation in the drawing is regarded as positive.

Figure 3C:
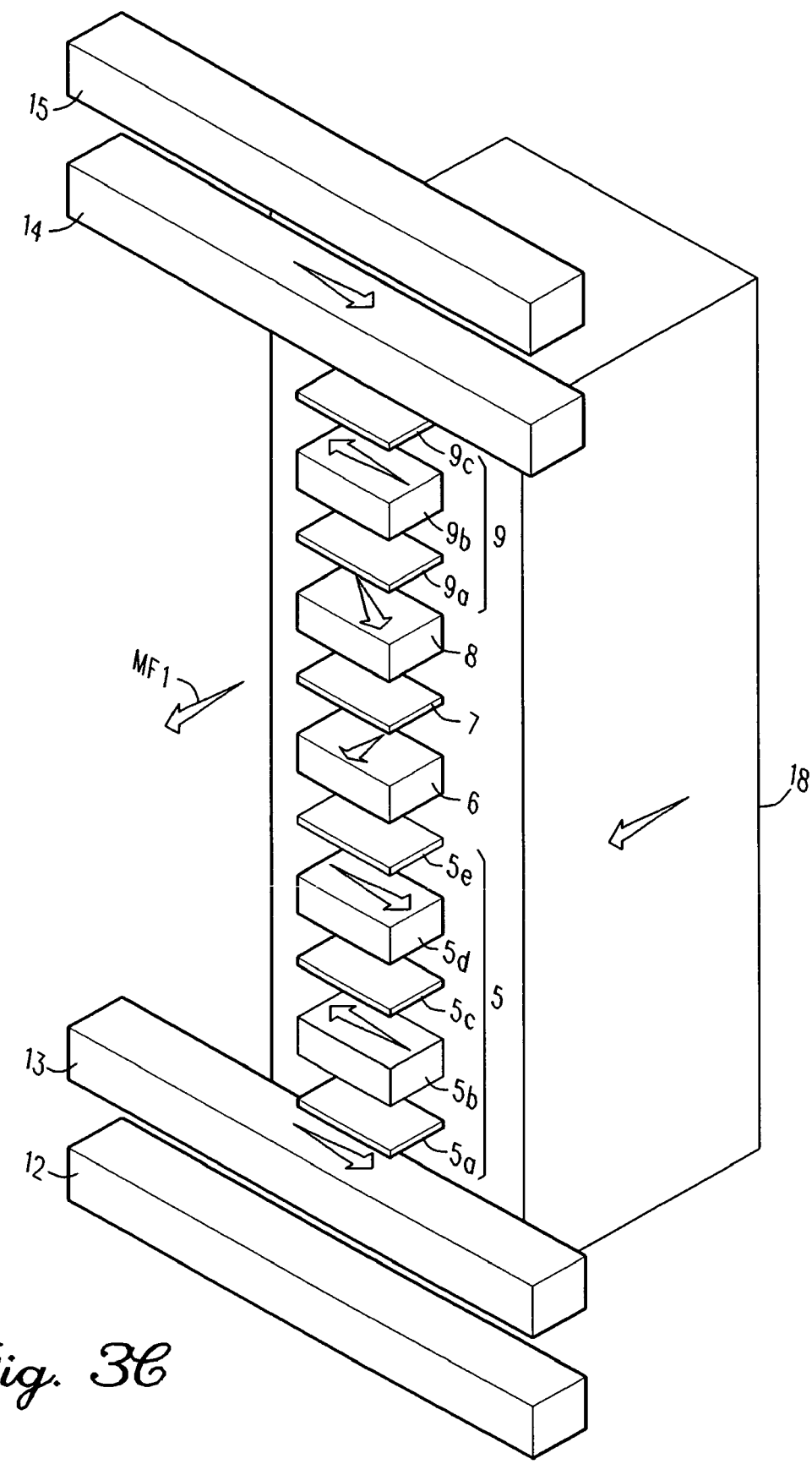
Figure 3D:
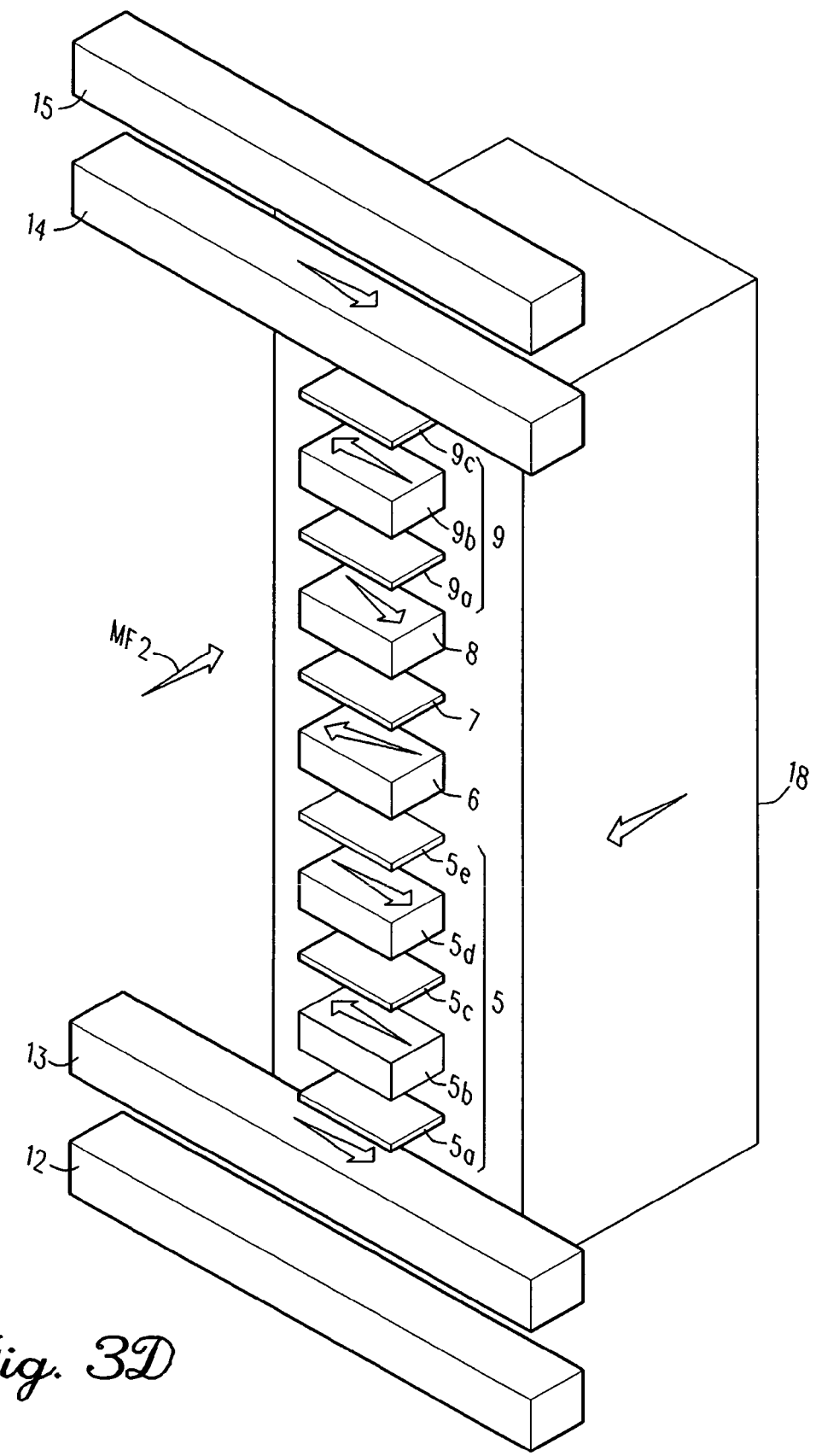

When the external magnetic field from the recording medium M is applied in this state, the relative angle formed with the direction of magnetization of the first MR magnetic layer 6 and that of the second MR magnetic layer 8 increases or decreases according to the direction of the magnetic field. Specifically, as shown in FIG. 3C, when a magnetic field MF1 that is orientated toward the recording medium M from the ABS S is applied from the recording medium M, the directions of magnetization of the first MR magnetic layer and the second MR magnetic layer 8 further rotate toward the ABS S, and the directions of magnetization of the first MR magnetic layer 6 and the second MR magnetic layer 8 are close to the parallel state C (state D in FIG. 4). As approaching the parallel state, it becomes more difficult to scatter electrons to be supplied from the electrodes (the upper and lower shield layers 3 and 4), and an electrical resistance value of the sense current is decreased. In other words, the signal output is reduced. In the meantime, when the magnetic field MF2 orientated toward the ABS S from the recording medium M is applied, inversely, the directions of magnetization of the first MR magnetic layer 6 and the second MR magnetic layer 8 rotate toward the away direction from the ABS S, and the directions of magnetization of the first MR magnetic layer 6 and the second MR magnetic layer 8 are close to the antiparallel state (the state E in FIG. 4). The closer the state becomes to the antiparallel state, the more easily electrons to be supplied from the electrodes are scattered, and the electrical resistance value of the sense current is increased. In other words, the signal output is increased. As described above, the external magnetic field can be detected by utilizing a change in a relative angle formed with the directions of magnetization of the first MR magnetic layer 6 and the second magnetic layer 8.

In the first and second magnetic coupling layers 5 and 9, the directions of magnetization of the inside of the magnetic layers are solidly secured due to exchange coupling, and they are unsusceptible by the external magnetic field. Consequently, the magnetization of the first MR magnetic layer 6 and the second MR magnetic layer 8 are unsusceptible by fluctuation in the directions of magnetization of the first and second magnetic coupling layers 5 and 9, and the directions of magnetization can be changed mainly in response to the external magnetic field.

In this embodiment, thickness and shape of the bias magnetic field application layer 18 are adjusted in order for the directions of magnetization of the first MR magnetic layer 6 and the second magnetic layer 8 to be at right angles in the state B (initial magnetized state). If the directions of magnetization are at right angles to each other in the initial magnetized state, as it is clear from FIG. 4, a change in output (inclination of signal output) to a change in the external magnetic field becomes greater and a great rate of change in magnetoresistance can be obtained; concurrently, an excellent output symmetrical property can be obtained.

As described above, the first and second magnetic coupling layers 5 and 9 have a function to transmit information regarding the directions of magnetization of the first and second anti-parallel layers 13 and 14, particularly, anisotropic properties in the directions of magnetization to the first and second MR magnetic layers 6 and 8, respectively. However, it requires an attention that the first and second magnetic coupling layers 5 and 9 also have a function to adjust the read gap, respectively. Although a target value of the read gap is determined based upon track recording density to be realized by the thin film magnetic head; however, because the thickness of the first and second MR magnetic layers 6 and 8 and the thickness of the nonmagnetic middle layer 7 are determined according to other various factors, the first and second magnetic coupling layers 5 and 9 have a function to adjust the read gap to a desired size.

The thickness of the Ru layer forming the first and second magnetic coupling layers 5 and 9 has a small degree of freedom as described above, and in order to fix the magnetization of the CoFe layer to the external magnetic field, the thickness of the CoFe layer cannot be thickened so much. Then, when the first and second magnetic coupling layers 5 and 9 require greater thickness, it is desirable to increase the number of laminated layers in the Ru layer and the CoFe layer. For example, in this embodiment, the first and second magnetic coupling layers 5 and 9 adopt three-layer configuration with Ru layer/CoFe layer/Ru layer or five-layer configuration with Ru layer/CoFe layer/Ru layer/CoFe layer/Ru layer; however, or other configuration, such as a seven-layer configuration with Ru layer/CoFe layer/Ru layer/CoFe layer/Ru layer/CoFe layer/Ru layer can be used.

When the layer configuration of the first and second magnetic coupling layers 5 and 9 are set, it is desirable to consider the points mentioned below. If magnetizing directions of the first and second antiferromagnetic layers 12 and 15 are aligned in the same direction, the magnetization state is stabilized according to a reason for magnetizing process. Consequently, in this embodiment, the first and second antiferromagnetic layers 12 and 15 are magnetized toward a left-pointing direction in FIG. 3A. It is needless to say, both the first and second antiferromagnetic layers 12 and 15 can be magnetized to the right-pointing. Further, it is desirable that the first MR magnetic layers 6 and the second MR magnetic layer 8 are magnetized in antiparallel by interposing the nonmagnetic middle layer 7. In this embodiment, in order to fulfill these conditions, the number of combinations with Ru layer/CoFe layer for antiferromagnetic coupling are adjusted. In other words, if the first magnetic coupling layer 5 has the five-layer configuration with Ru layer/CoFe layer/Ru layer/CoFe layer/Ru layer and the second magnetic coupling layer 9 has a three-layer configuration with Ru layer/CoFe layer/Ru layer, the first MR magnetic layer 6 and the second MR magnetic layer 8 are magnetized in antiparallel. The first magnetic coupling layer 5 may have a three-layer configuration with Ru layer/CoFe layer/Ru layer and the second magnetic coupling layer 9 may have a five-layer configuration with Ru layer/CoFe layer/Ru layer/CoFe layer/Ru layer.

In the case that the desired read gap is small, it can be considered that either the first and second magnetic coupling layers 5 and 9 have a single layer configuration with the Ru layer. The film configuration when the second magnetic coupling layer 9 has a single configuration with a Ru layer is shown in Table 2. The first magnetic coupling layer 5 has a three-layer configuration with Ru layer/CoFe layer/Ru layer so as to align the directions of magnetization of the first and second antiferromagnetic layers 12 and 15 and to magnetize the first MR magnetic layer 6 and the second MR magnetic layer 8 in antiparallel. It is needless to say, the first magnetic coupling layer 5 can have a single layer configuration with a Ru layer and the second magnetic coupling layer 9 can have a three-layer configuration with Ru layer/CoFe layer/Ru layer. In addition, if the directions of magnetization of the first and second antiferromagnetic layers are opposite from each other, it is also possible that both the first and second magnetic coupling layers 5 and 9 can have a single layer configuration with Ru layer.

TABLE 2

| | Layer constitution | | Thickness (nm) | Direction of magnetization |
|---|---|---|---|---|
| Upper shield layer 4 | Second main shield layer 16 | NiFe layer | 1000-2000 | |
| | Second antiferromagnetic layer 15 | IrMn layer | 6 | ← |
| | Second exchange coupling magnetic field application layer 14 | CoFe layer 14b | 1.5 | |

TABLE 2-continued

| | Layer constitution | | Thickness (nm) | Direction of magnetization |
|---|---|---|---|---|
| | | NiFe layer 14a | 20 | ← |
| MR laminated body 2 | Second magnetic coupling layer 9 | Ru layer | 0.8 | |
| | Second MR magnetic layer 8 | CoFe layer | 3 | → |
| | Nonmagnetic middle layer 7 | ZnO layer | 2 | |
| | First MR magnetic layer 6 | CoFe layer | 3 | ← |
| | First magnetic coupling layer 5 | Ru layer 5c | 0.8 | |
| | | CoFe layer 5b | 1 | → |
| | | Ru layer 5a | 0.8 | |
| Lower shield layer 3 | First exchange coupling magnetic field application layer 13 | NiFe layer 13b | 20 | ← |
| | | CoFe layer 13a | 1.5 | ← |
| | First antiferromagnetic layer 12 | IrMn layer | 6 | |
| | First main shield layer 11 | NiFe layer | 1000-2000 | |

As described above, in the thin film magnetic head of the present invention, it is possible to be configured to have a magnetic layer (magnetic coupling layer) containing at least one layer of Ru layer at least either between the first MR magnetic layer 6 and the first anti-parallel layer 13 and between the second MR magnetic layer 8 and the second anti-parallel layer 14. Further, it is also possible to be configured to have a magnetic coupling layer composed with a Ru layer at least either between the first MR magnetic layer 6 and the first anti-parallel layer 13 and between the second MR magnetic layer 8 and the second anti-parallel layer 14.

In the case of using a plurality of CoFe layers, it is possible to align the thickness of each CoFe layer. The CoFe layers are magnetized by the external magnetic field and the direction of magnetization attempts to rotate toward the external magnetic field; however, if the thickness of the CoFe layers is different, the CoFe layers with greater thickness overcomes the exchange coupling force and it becomes easier to rotate. As a result, the function to transmit the information regarding the direction of magnetization of the first and second anti-parallel layers 13 and 14 to the first and second MR magnetic layers 6 and 8 is inhibited.

Next, a metal foundation layer 42 formed between the insulating layer 17 and the second anti-parallel layer 14 will be described. FIG. 5A is a pattern perspective view of the MR laminated body, the metal foundation layer 42, the second anti-parallel layer 14 and the second antiferromagnetic layer 15. In said diagram, an illustration of the insulating layer 17 is omitted. FIG. 5B is a cross sectional view of the second antiferromagnetic layer along sectional line 5B-5B of FIG. 5A.

The second antiferromagnetic layer 15 is made of IrMn, Fe—Mn, Ni—Mn, Pt—Mn or Pd—Pt—Mn; however, these alloys generally have considerably great particle diameter, with several dozens nm. In the meantime, the planar dimension of the MR laminated body 2 tends to be reduced associated with the high recording density of the magnetic head, and the track width direction T and height direction H of the upper shield layer side end surface 43 are approximately 100 nm in one example. Consequently, as shown in FIG. 5B, only several grains, such as IrMn, exist in a projection area A1 of the upper shield layer side end surface 43 of the MR laminated body 2 to the film surface's orthogonal direction P (in other words, directly above the area of the MR laminated body 2 from the lamination direction).

The second antiferromagnetic layer 15 is annealed in the state where the external magnetic body is applied and the direction of magnetization is fixed. As shown in FIG. 5B, the upward direction in the drawing is regarded as 0 degrees and the angle θ is defined so as to increase in a clockwise direction, and a case where the right-pointing external magnetic field is applied from the left side in the drawing is considered. A magnetization easy axis 44 exists for each grain G in the alloy, such as IrMn, and when the external magnetic field is applied, the alloy is magnetized along the magnetization easy axis 44 per grain G. Since the magnetization easy axes 44 of the grain G are distributed at random, the grain G is magnetized to a random direction at the angle θ within the range from 0 degrees to 180 degrees, i.e., to have a right-point component in the drawing.

Because the grain G within the projection area A1 is situated the closest to the MR laminated body 2, the exchange magnetic field effectively affects the second MR magnetic layer 8 of the MR laminated body 2. The direction of the exchange magnetic field where the grains G within the projection area A1 affects the MR laminated body 2 as a whole depends upon the size of individual grain G, but is basically equal to the average direction of magnetization of the grains G within the projection area A1. However, because the number of grains G within the projection area A1 is several orders, the average orientation of the exchange magnetic field greatly varies according to the magnetic head. For example, in the case of FIG. 5B, for the direction of magnetization of the grain G, because the angle θ is mainly distributed within the range of 90 degrees to 180 degrees, it appears that the average direction of magnetization is 120 degrees to 130 degrees, and it is shifted by 30 degrees to 40 degrees with respect to 90 degrees, which is an ideal direction of magnetization. In another magnetic head, inversely, the average direction of magnetization θ may be approximately 50 degrees to 60 degrees. As a result, the direction of magnetization of the second MR magnetic layer 8 varies in the magnetic field-free state, as well. Consequently, the ideal initial magnetized state B shown in FIG. 4 cannot be obtained, and the rate of change in magnetoresistance is not only decreased but the variation of the rate of change in magnetoresistance is also increased. This will not be a problem with the conventional magnetic head that is not involved with the magnetization control of the MR magnetic layer. However, in the upper shield layer 4 that controls the magnetization of the second MR magnetic layer 8, and that is used for the second antiferromagnetic layer 15, because the magnetization state of the second antiferromagnetic layer 15 in the vicinity of the MR laminated body 2 directly affects the behavior of the second MR magnetic layer 8, it is a big problem. In the future, if the width in the track direction and the dimension in the height dimension are reduced, this problem becomes more obvious.

Furthermore, a similar problem could occur with the first anti-parallel layer 13. However, according to the reason for the production process, normally, the MR laminated body 2 has a trapezium or circular truncated cone shape where the upper shield layer end surface 43 is narrowed and the lower shield side end surface 45 is widened. Consequently, since many grains are accommodated in the lower shield side end surface 45 and the average direction of magnetization tends to be orientated toward the track width direction T, this will not be a big problem.

In this embodiment, the exchange coupling intensity relating to the antiferromagnetic coupling between the second anti-parallel layer 14 and the second antiferromagnetic layer 15 is greater in the peripheral area A2 of the projection area A1 than that in the projection area A1. In other words, the exchange coupling intensity of the projection area A1 is set relatively smaller than that in the peripheral area A2. Although not only the exchange coupling magnetic field from the projection area A1 but the exchange coupling magnetic field form the peripheral area A2 is also applied to the MR laminated body 2, the contribution from the peripheral area A2 can be greater by increasing the exchange coupling intensity of the peripheral area A2. Since the peripheral area A2 has a far greater film area than the projection area A1, the number of grains G is incomparably numerous. Consequently, even though the direction of magnetization of individual grain G varies similarly to that of the grains G in the projection area A1, the average magnetization, i.e., macro direction of magnetization tends to be orientated toward the track width direction T. Therefore, an effect of the fluctuation in the direction of magnetization in the projection area A1 of the second antiferromagnetic body 15 is inhibited, thus the exchange magnetic field in the track width direction T can be stably applied to the MR laminated body 2.

Further, the inventor of the present application believes that an effect to correct the average direction of magnetization in the projection area A1 to the track width direction T can be obtained by increasing the exchange coupling intensity of the peripheral area A2. In other words, a similar effect to applying the bias magnetic field in the track width direction T from the peripheral area A2 toward the projection area A1 can be obtained.

As described above, as one of the measures to increase the exchange coupling intensity of the peripheral area A2, in this embodiment, the metal foundation layer having a crystal structure of amorphous, body-centered cubic lattice or close-packed hexagonal lattice is used between the insulating layer 17 and the second anti-parallel layer 14. The metal foundation layer 42 is a foundation material of the second anti-parallel layer 14. As described below, the change of the metal foundation layer 42 in the peripheral area enables the adjustment of the exchange coupling intensity of the second antiferromagnetic body 15 and the second anti-parallel layer 14.

The thin film magnetic head in this embodiment can be produced with the method mentioned below. First, the lower shield layer 3 is prepared on a substrate 91 (see FIG. 1), and next, each layer constructing the MR laminated body 2 is formed on the lower shield layer 3 by the sputtering method. Next, these layers are patterned, respectively, and portions at both sides of the track width direction T are buried with the insulating film 17. After that, a section up to a portion equivalent to height H (see FIG. 1) of the element is left and milled from the ABS S, and the bias magnetic field application layer 18 is formed via the insulating layer 19. As described above, the insulating layer 17 is formed on the both sides of the MR laminated body 2 in the track width direction T, and the bias magnetic field application layer 18 is formed on the rear surface of the MR laminated body 2 viewed from the ABS S. After that, the upper shield layer 4 is formed. In addition, the above-mentioned writing part 20 is formed with a well-known technique.

EXAMPLE 1

After the first main shield layer 11 (NiFe) is formed using a plating method, a foundation layer (NiFe 0.5 nm, not shown), the first antiferromagnetic layer 12 (IrMn 5 nm), the first anti-parallel layer 13 (CoFe 2.0 nm/NiFe 4.0 nm), the first magnetic coupling layer 5 (Ru 0.7 nm/CoFe 1.0 nm/Ru 0.7 nm/CoFe 1.0 nm/Ru 0.7 nm), the first MR magnetic layer 6 (NiFe 4.0 nm/CoFe 2.0 nm), the nonmagnetic middle layer 7 (MgO 1.0 nm), the second MR magnetic layer 8 (CoFe 2.0 nm/NiFe 4.0 nm), the second magnetic coupling layer 9 (Ru 0.7 nm/CoFe 1.0 nm/Ru 0.7 nm/CoFe 1.0 nm/Ru 0.7 nm), a sacrifice magnetic layer (NiFe 2 nm) and a cap layer (Ru 2 nm) were formed in respective order using a magnetron sputtering method. After the film formation, a thermal treatment at 250° C. for 3 hours was applied, and after that, the above-mentioned film was processed to a column with 100×100 nmϕ, and the side surface in the track width direction was covered with the insulating layer ($Al_2O_3$) with 5.0 nm of thickness. In addition, the side surface over the insulating layer 19 was buried with the foundation layer 42 with 25 nm of thickness (X) (see FIG. 2A for thickness X). The bias magnetic field application layer 18 was formed on the rear surface viewed the ABS S of the MR laminated body 2. After that, the surface of the film was scraped by a light reverse sputtering method, and a majority portion of the sacrifice magnetic layer and the cap layer was removed. In addition, the second anti-parallel layer 14 (NiFe 4.0 nm/CoFe 2.0 nm), the second antiferromagnetic layer 15 (IrMn 5 nm) and the second main shield layer 16 (NiFe) were formed, respectively, and an element shown in FIG. 2A was obtained. The materials of the foundation layer are regarded as parameters, and each material shown in Table 3 was used. Outputs of 100 elements were measured for each material, and an average value and standard deviation were calculated. An output average of the element using $Al_2O_3$ for the foundation layer 42 was regarded as 1 and the output average was standardized. An output standard deviation/output average of the element using $Al_2O_3$ for the foundation layer 42 was regarded as 1 and the standard deviation was standardized. The result is shown in Table 3.

Further, in order to check the effect of a difference in materials of the foundation layer on the exchange coupling intensity between the anti-parallel layer and the antiferromagnetic layer, the foundation layer (0.5 nm), the anti-parallel layer (NiFe 4.0 nm/CoFe 2.0 nm), the antiferromagnetic layer (IrMn 5 nm) and the cap layer (Ru 2 nm) were formed in respective order over a silicon wafer with a thermally-oxidized film using the magnetron sputtering method. For the obtained samples, a magnetic field where the exchange coupling between the antiferromagnetic layer and the exchange coupling magnetic applied layer is cut, i.e., the exchange coupling intensity (Hex) was measured using a vibrating sample magnetometer (VSM). The obtained Hex for each material for the foundation material is shown in Table 3 together. In the table, bcc represents a body-centered cubic lattice; hcp represents a close-packed hexagonal lattice, and fcc represents a face-centered cubic lattice. Further, Cr80Ti20 means that atomic fractions of Cr and Ti are 80% and 20%, respectively.

TABLE 3

| Material | Structure | Hex (Oe) | Hex (kA/m) | Output average | Output standard deviation |
|---|---|---|---|---|---|
| Ta | Amorphous | 570 | 45.4 | 1.10 | 0.42 |
| Cr | bcc | 480 | 38.2 | 1.08 | 0.41 |
| $Cr_{80}Ti_{20}$ | bcc | 490 | 39.0 | 1.09 | 0.45 |
| Ru | hcp | 450 | 35.8 | 1.08 | 0.56 |
| Rh | fcc | 300 | 23.9 | 1.04 | 0.81 |
| Pd | fcc | 290 | 23.1 | 1.05 | 0.81 |
| Cu | fcc | 290 | 23.1 | 1.03 | 0.83 |
| Al | fcc | 280 | 22.3 | 1.04 | 0.83 |
| $SiO_2$ | | 250 | 19.9 | 0.98 | 0.99 |
| $Al_2O_3$ | | 270 | 21.5 | 1.00 | 1.00 |

Ta (amorphous), Cr (bcc), Cr80Ti20 (bcc) and Ru (hcp) showed high Hex. Since these materials showed higher Hex compared to fcc-series materials, the crystal-series of a material to be foundation is important. In the meantime, an oxide, such as $Al_2O_3$ or $SiO_2$, showed lower Hex. It appears that the diffusion of oxygen affects this.

Figure 6A:
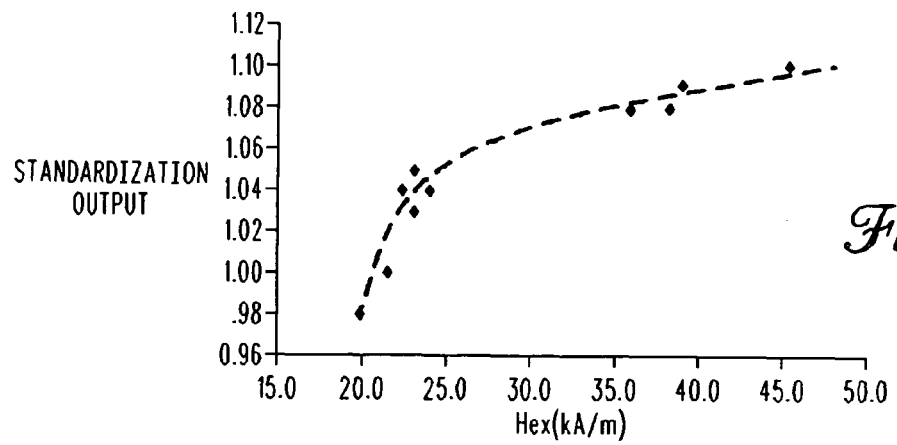
FIG. 6A is a graph showing a relationship between the exchange coupling intensity Hex and an output average.
Figure 6B:
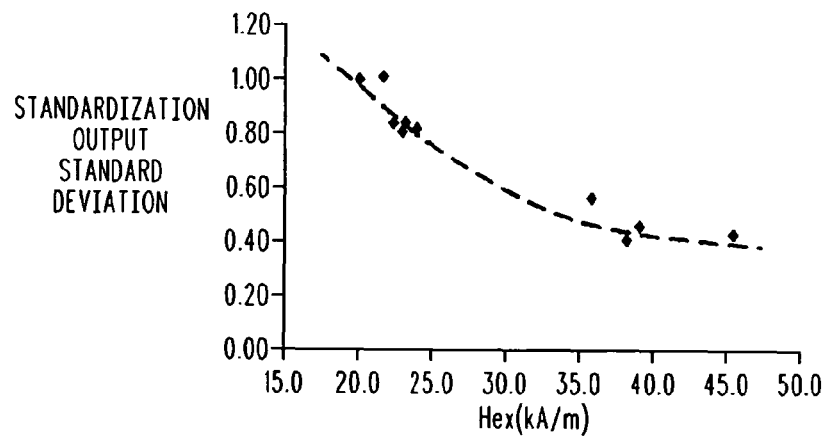
FIG. 6B is a graph showing a relationship between the exchange coupling intensity Hex and an output standard deviation.

FIGS. 6A and 6B show a relationship between the exchange coupling intensity Hex and the output average and a relationship between the exchange coupling intensity Hex and the output standard deviation, respectively. A positive correlation and a negative correlation exist between Hex and the output average and between Hex and output standard deviation, respectively, and it was confirmed that the higher Hex the more preferable. According to this example, it was ascertained that as a material of the foundation layer 42 of the second anti-parallel layer 14, amorphous metal, metal with bcc crystal structure, metal with hcp crystal structure and metal with fcc crystal structure are preferable in respectively order, and oxide is not appropriate.

EXAMPLE 2

Figure 7:
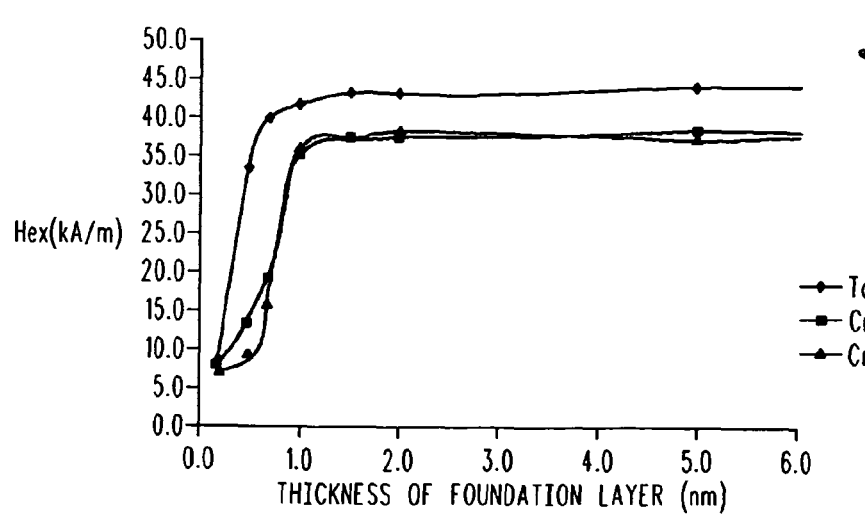
FIG. 7 is a graph showing a relationship between thickness of a metal foundation layer made of a typical material and the exchange coupling intensity.
Figure 8:
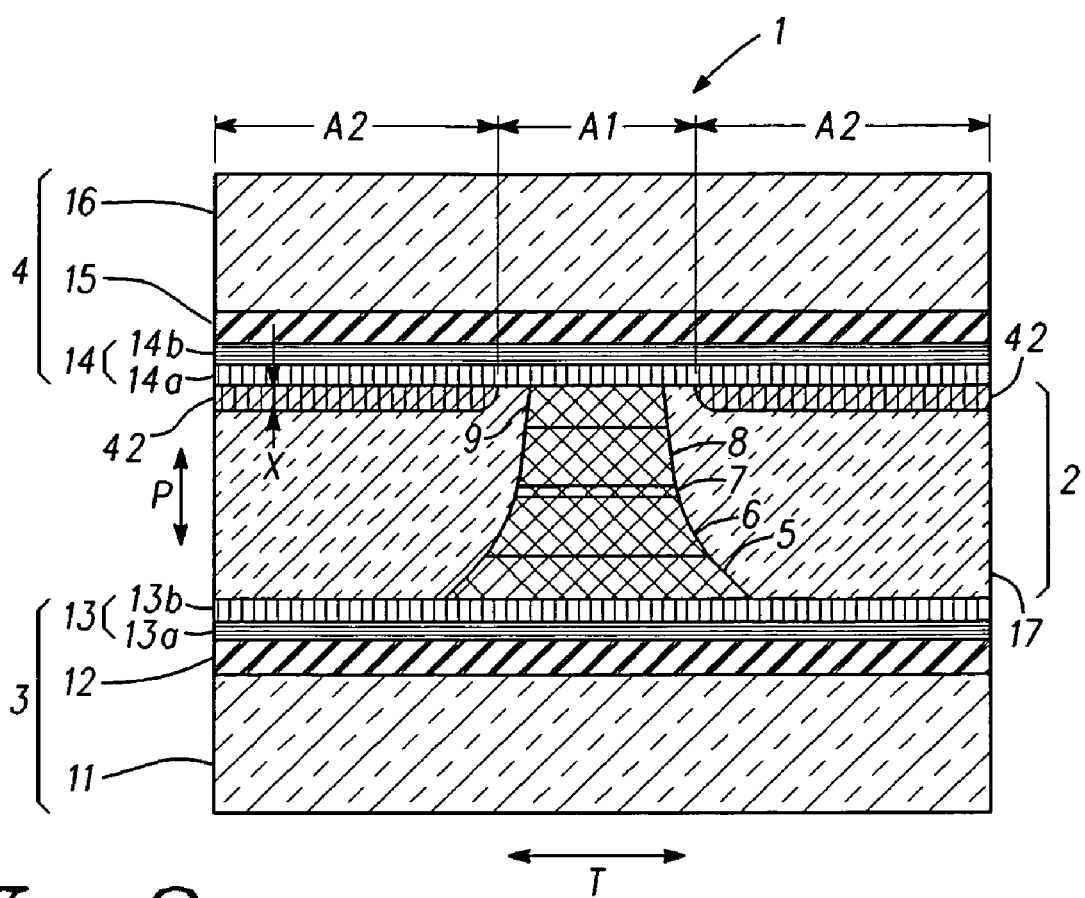
FIG. 8 is a side view of the reading part of the thin film magnetic head in another embodiment.

It is known in general that some thickness is required for a material to function as a foundation layer. Then, the thickness required as a metal foundation layer to be laminated on alumina of amorphous was estimated. As the materials of the metal foundation layer, three types, Ta, Cr and CrTi, showing high Hex in Example 1 were used. Specifically, an $Al_2O_3$ layer (10 nm), a foundation layer (Ta, Cr, CrTi), the anti-parallel layer (NiFe 4.0 nm/CoFe 2.0 nm), the antiferromagnetic layer (IrMn 5 nm) and the cap layer (Ru 2 nm) were formed over a silicon wafer with thermally-oxidized film in respective order using the magnetron sputtering method. For the obtained samples, the exchange coupling intensity (Hex) between the antiferromagnetic layer and the exchange coupling magnetic field layer were measured using VSM. The results are shown in Table 4 and FIG. 7. For the all three types of materials, it was ascertained that Hex stays with 10% or less reduction from the value for 25 nm of thickness, and they sufficiently function as a foundation layer, respectively. Furthermore, FIG. 8 shows an outlined cross section of the thin film magnetic head in the case of using a thin metal foundation layer.

TABLE 4

| Foundation layer thickness (nm) | Hex (Oe) | | | Hex (kA/m) | | |
|---|---|---|---|---|---|---|
| | Ta | Cr | CrTi | Ta | Cr | CrTi |
| 0.2 | 110 | 100 | 90 | 8.8 | 8.0 | 7.2 |
| 0.5 | 420 | 170 | 120 | 33.4 | 13.5 | 9.5 |
| 0.7 | 500 | 240 | 200 | 39.8 | 19.1 | 15.9 |
| 1.0 | 520 | 440 | 450 | 41.4 | 35.0 | 35.8 |
| 1.5 | 540 | 470 | 470 | 43.0 | 37.4 | 37.4 |
| 2.0 | 540 | 470 | 480 | 43.0 | 37.4 | 38.2 |
| 5.0 | 550 | 480 | 470 | 43.8 | 38.2 | 37.4 |
| 10.0 | 560 | 480 | 480 | 44.6 | 38.2 | 38.2 |
| 25.0 | 570 | 480 | 490 | 45.4 | 38.2 | 39.0 |

As described above, in the thin film magnetic head in the embodiment and examples, the first and second MR magnetic layers 6 and 8 whose directions of magnetization are changed according to the external magnetic field are magnetized in antiparallel to each other in the magnetic field-free state by the exchange coupling magnetic field from the first and second anti-parallel layers 13 and 14 via the first and second magnetic coupling layers 5 and 9, respectively. Therefore, it is unnecessary to use a material providing an exchange coupling effect for the nonmagnetic middle layer 7, and it becomes possible to appropriately use a material that can demonstrate a magnetic resistance effect at maximum, and a high rate of change in magnetoresistance can be obtained. Since the first and second anti-parallel layers 13 and 14 are solidly magnetized by the first and second antiferromagnetic layers 12 and 15, the magnetization state of the first and second MR magnetic layers 6 and 8 can be easily controlled, and a rate of change in magnetoresistance with less variation can be obtained. In addition, since the first and second anti-parallel layers 13 and 14 and the first and second antiferromagnetic layers 12 and 15 provide a function of the shield layers 3 and 4, it also contributes to the reduction of read gap. In other words, in the thin film magnetic film in the present embodiment and examples, the first and second anti-parallel layers 13 and 14 and the first and second antiferromagnetic layers 12 and 15 function both as a magnetic control layer for controlling the magnetization state of the first and second MR magnetic layers 6 and 8 and as the shield layer, respectively.

In addition, the exchange coupling intensity relating to the antiferromagnetic coupling between the second anti-parallel layer 14 and the second antiferromagnetic layer 15 is greater in the peripheral area A2 than that in the projection area A1. Consequently, even if the direction of magnetization of the second antiferromagnetic layer 15 varies in the projection area A1, the effect is reduced and the second MR magnetic layer 8 can be magnetized to the track width direction T in the magnetic field-free state. As a result, the variation of the magnetization state of the second MR magnetic layer 8 in the magnetic field-free state is controlled, and simultaneously, a more preferable magnetic state can be easily obtained. A high rate of change in magnetoresistance can be obtained as described above, and a thin film magnetic head with less variation in the rate of change in magnetoresistance and easy reduction of read gap can be obtained.

Next, a wafer used for production of the above-mentioned thin film magnetic head will be described. Seeing FIG. 9, a laminated body composing at least the above-mentioned thin film magnetic head is formed over a wafer 100. The wafer 100 is divided into a plurality of bars 101, which are an operating unit on the occasion of polishing processing or the ABS S. The bars 101 are further cut after the polishing processing, and divided into sliders 210 including the thin film magnetic head. Margins (not shown) for cutting the wafer 100 into the bars 101 and the bars 101 into the sliders 210 are established in the wafer 100.

Referring to FIG. 10, the slider 210 has substantially a hexahedral shape, and one surface among them is the ABS S opposing a hard disk.

Referring to FIG. 11, a head gimbal assembly 220 is equipped with a slider 210 and a suspension 221 for elastically supporting the slider 210. The suspension 221 has a plate spring-state load beam 222 formed from stainless steel, a flexure 223 established at one end of the load beam 222 and a base plate 224 established at the other end of the load beam 222. The slider 210 is joined with the flexure 223, and the flexure provides the slider 210 appropriate degree of freedom. A gimbal part for maintaining a posture of the slider to be constant is established in the portion where the slider is mounted.

The slider 210 is arranged within the hard disk device so as to face against the hard disk, which is a disk-shaped recording medium to be revolved. When the hard disk revolved to the z-direction in FIG. 11, a lift force is generated to the slider 210 downward in the y-direction by airflow passing between the hard disk and the slider 210. The slider 210 is designed to float from the surface of the hard disk by this lift force. The thin film magnetic head 1 is formed in the vicinity of the end (end portion in the lower left in FIG. 10) at the airflow side of the slider 210.

A component where the head gimbal assembly 220 is mounted to an arm 230 is referred to as a head arm assembly 221. The arm 230 moves the slider 210 toward the track transverse direction x of the hard disk 262. One end of the arm 230 is mounted to the base plate 224. A coil 231, which is a portion of the voice coil motor, is mounted to the other end of the arm 230. A bearing part 233 is established in the intermediate portion of the arm 230. The arm 230 is supported by the a shaft 234 mounted to the bearing part 233 to be rotatable. The arm 230 and the voice coil motor for driving the arm 230 comprise an actuator.

Figure 12:
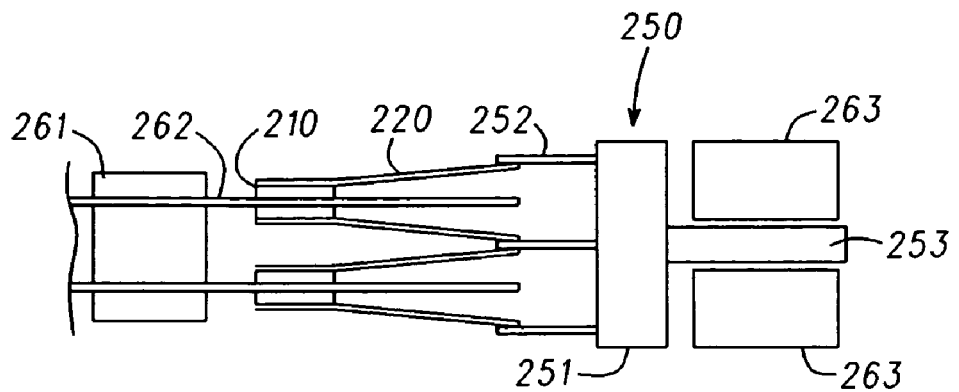
FIG. 12 is a side view of the head arm assembly where the slider of the present invention is incorporated.
Figure 13:
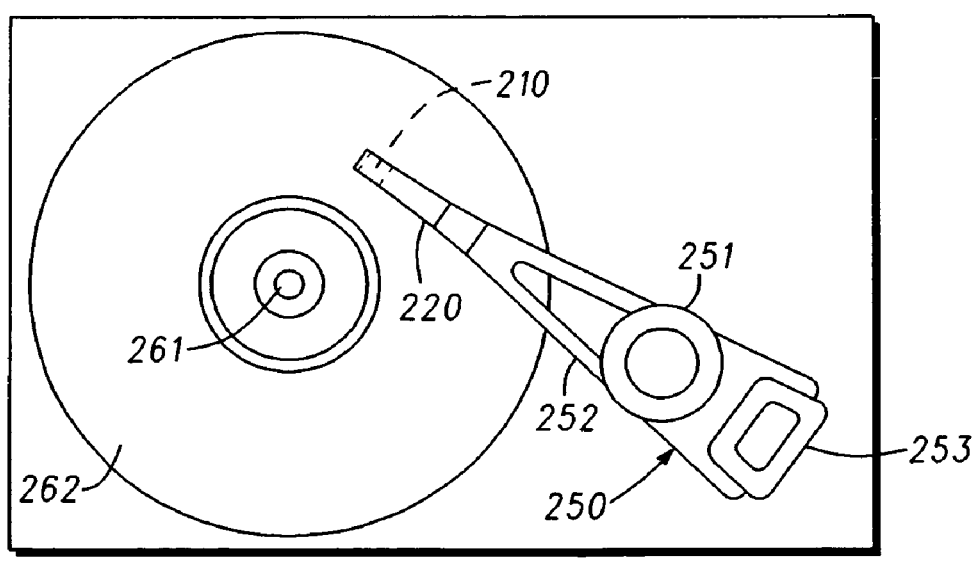
FIG. 13 is a plan view of a hard disk device where the slider of the present invention is incorporated.

Next, referring to FIG. 12 and FIG. 13, a head stack assembly where the slider is incorporated and the hard disk device will be described. The head stack assembly is an assembly where the head gimbal assemblies 220 are mounted to the arms of the carriage having a plurality of arms, respectively. FIG. 12 is a side view of the head stack assembly, and FIG. 13 is a plan view of the hard disk device. The head stack assembly 250 has a carriage 251 having a plurality of arms 252. The head gimbal assemblies 220 are mounted to each arm 252 so as to align vertically at intervals. A coil 253, which is a portion of the voice coil motor, is mounted to the opposite side of the arm 252. The voice coil motor has permanent magnets 263 arranged at opposing positions by interposing the coil 253.

Referring to FIG. 13, the head stack assembly 250 is incorporated into the hard disk device. The hard disk device has a plurality of pieces for hard disks 262 mounted to spindle motors, respectively. Two sliders 210 are arranged so as to interpose with the hard disk 262 and to face toward each other for each hard disk 262. The head stack assembly 250 except for the slider 210 and the actuator support the slider 210 by corresponding to a positioning device in the present invention; concurrently, the slider 210 is positioned to the hard disk 262. The slider 210 is moved toward the track transverse direction of the hard disk 262 by the actuator, and is positioned to the hard disk 262. The thin film magnetic head 1 contained in the slider 210 records information into the hard disk 262 by the recording head, and replays the information recorded in the hard disk 262 by the playing head.

Although preferable embodiments of the present invention were presented and described in detail, it is necessary to understand that they can be variably modified and corrected without departing from the scope of the attached claims.

What is claimed is:

1. A thin film magnetic head, comprising
   a magneto-resistance (MR) laminated body that has a first magneto-resistance (MR) magnetic layer with a direction of magnetization that is changed according to an external magnetic field, a nonmagnetic middle layer and a second magneto-resistance (MR) magnetic layer with a direction of magnetization that is changed according to the external magnetic field, and wherein the first MR magnetic layer, the nonmagnetic middle layer and the second MR magnetic layer are respectively laminated by contacting each other in the order;
   a lower shield layer and an upper shield layer that face the first MR magnetic layer and the second MR magnetic layer, respectively, and which are arranged in a matter of sandwiching the MR laminated body in an orthogonal direction relative to a film surface of the MR laminated body, and also which function as electrodes for flowing a sense current in the orthogonal direction relative to the film surface of the MR laminated body; and
   a bias magnetic field applying means that is established on an opposite surface from an air bearing surface (ABS) of the MR laminated body, and that applies a bias magnetic field in a direction at right angles to the ABS to the MR laminated body, wherein
   the lower shield layer has
      a first anti-parallel layer that faces the first MR magnetic layer, and that applies an anti-parallel coupling magnetic field in parallel to the ABS to the first MR magnetic field; and
      a first antiferromagnetic layer that is formed on the rear surface of the first anti-parallel layer viewed from the first MR magnetic layer, the first antiferromagnetic layer being in contact with the first anti-parallel layer and being exchange coupled with the first anti-parallel layer;
   the upper shield layer has
      a second anti-parallel layer that faces the second MR magnetic layer, and that applies an anti-parallel coupling magnetic field to the second MR magnetic layer, the exchange coupling magnetic field being in a parallel direction to the ABS and in an antiparallel direction to an anti-parallel coupling magnetic field applied to the first MR magnetic layer by the first anti-parallel layer;
      a second antiferromagnetic layer is established on the rear surface of the second anti-parallel layer viewed from the second MR magnetic field, the second antiferromagnetic layer being in contact with the second anti-parallel layer and being exchange coupled with the second anti-parallel layer; and
   the exchange coupling intensity relating to the exchange coupling between the second anti-parallel layer and the second antiferromagnetic layer is greater in the peripheral area of a projection area than that of the projection area of the upper shield layer side end surface of the MR laminated body to the film surface's orthogonal direction.

2. The thin film magnetic head according to claim 1, wherein the bias magnetic field applying means is a bias magnetic field application layer.

3. The thin film magnetic head according to claim 1, wherein the MR laminated body has a first exchange coupling transmission layer comprising of a magnetic layer including at least one layer made of ruthenium (Ru) layer at least either between the first MR magnetic layer and the first anti-parallel layer or between the second MR magnetic layer and the second anti-parallel layer.

4. The thin film magnetic head according to claim 1, wherein
the MR laminated body has a first anti-parallel coupling transmission layer comprising of a ruthenium (Ru) layer at least either between the first MR magnetic layer and the first anti-parallel layer or between the second MR magnetic layer and the second anti-parallel layer.

5. A slider comprising the thin film magnetic head according to claim 1.

6. A head gimbal assembly having the slider according to claim 5 and a suspension flexibly supporting the slider.

7. A hard disk device having the slider according to claim 5 and a device for supporting the slider concurrently, for positioning the slider with respect to a recording medium.

8. A wafer where a laminated body to be the thin film magnetic head according to claim 1 is formed.

9. A thin film magnetic head, comprising
a magneto-resistance (MR) laminated body that has a first magneto-resistance (MR) magnetic layer with a direction of magnetization that is changed according to an external magnetic field, a nonmagnetic middle layer and a second magneto-resistance (MR) magnetic layer with a direction of magnetization that is changed according to the external magnetic field, and wherein the first MR magnetic layer, the nonmagnetic middle layer and the second MR magnetic layer are respectively laminated by contacting each other in the order;
a lower shield layer and an upper shield layer that face the first MR magnetic layer and the second MR magnetic layer, respectively, and which are arranged in a matter of sandwiching the MR laminated body in an orthogonal direction relative to a film surface of the MR laminated body, and also which function as electrodes for flowing a sense current in the orthogonal direction relative to the film surface of the MR laminated body; and
a bias magnetic field applying means that is established on an opposite surface from an air bearing surface (ABS) of the MR laminated body, and that applies a bias magnetic field in a direction at right angles to the ABS to the MR laminated body; and
insulating layers established at both sides in the track width direction of the MR laminated body, wherein
the lower shield layer has:
a first anti-parallel layer that faces the first MR magnetic layer, and that applies an anti-parallel coupling magnetic field in parallel to the ABS to the first MR magnetic field; and
a first antiferromagnetic layer that is established on the rear surface of the first anti-parallel layer viewed from the first MR magnetic layer, the first antiferromagnetic layer being in contact with the first anti-parallel layer and being exchange coupled with the first anti-parallel layer;
the upper shield layer has a second anti-parallel layer that faces the second MR magnetic layer, and that applies an anti-parallel coupling magnetic field to the second MR magnetic layer, the exchange coupling magnetic field being in a parallel direction to the ABS and in an antiparallel direction to an exchange coupling magnetic field applied to the first MR magnetic layer by the first anti-parallel layer;
a second antiferromagnetic layer is established on the rear surface of the second anti-parallel layer viewed from the second MR magnetic field, the second antiferromagnetic layer being in contact with the second anti-parallel layer and being exchange coupled with the second anti-parallel layer; and
a metal foundation layer is disposed between the insulating layer and the second anti-parallel layer, the metal foundation layer having a crystal structure of amorphous, body-centered cubic lattice, or close-packed hexagonal lattice.

10. The thin film magnetic head according to claim 9, wherein the bias magnetic field applying means is a bias magnetic field application layer.

11. The thin film magnetic head according to claim 9, wherein the metal foundation layer is made of Ta, Cr, CrTi, or Ru.

12. The thin film magnetic head according to claim 11, wherein the thickness of the metal foundation layer is 1 nm or greater, and smaller than an interval between the upper shield layer and the lower shield layer.

13. The thin film magnetic head according to claim 1, wherein the first and second anti-parallel layers contain a CoFe alloy layer formed that is in contact with the first and second antiferromagnetic layers, respectively.

14. The thin film magnetic head according to claim 9, wherein the first and second anti-parallel layers contain a CoFe alloy layer formed that is in contact with the first and second antiferromagnetic layer, respectively.

15. The thin film magnetic head according to claim 9, wherein
the MR laminated body has a first anti-parallel coupling transmission layer comprising of a magnetic layer including at least one layer of ruthenium (Ru) layer at least either between the first MR magnetic layer and the first anti-parallel layer or between the second MR magnetic layer and the second anti-parallel layer.

16. The thin film magnetic head according to claim 9, wherein
the MR laminated body has a first anti-parallel coupling transmission layer comprising of a ruthenium (Ru) layer at least either between the first MR magnetic layer and the first anti-parallel layer or between the second MR magnetic layer and the second anti-parallel layer.

17. A slider comprising the thin film magnetic head according to claim 9.

18. A head gimbal assembly having the slider according to claim 17 and a suspension flexibly supporting the slider.

19. A hard disk device having the slider according to claim 17 and a device for supporting the slider concurrently, for positioning the slider with respect to a recording medium.

20. A wafer where a laminated body to be the thin film magnetic head according to claim 9 is formed.

* * * * *